US012690676B2

(12) United States Patent
Carral O Gorman et al.

(10) Patent No.: US 12,690,676 B2
(45) Date of Patent: Jul. 28, 2026

(54) DISPLAY SUPPORT SYSTEM AND METHOD FOR THE USE THEREOF

(71) Applicant: Steelcase Inc., Grand Rapids, MI (US)

(72) Inventors: Santiago Carral O Gorman, Grand Rapids, MI (US); Mark McKenna, East Grand Rapids, MI (US); Giorgio Verduzio, Grand Rapids, MI (US); Matthew David Remelts, Grand Rapids, MI (US); Mark J. Dinneweth, Spring Lake, MI (US)

(73) Assignee: Steelcase Inc., Grand Rapids, MI (US)

( * ) Notice: Subject to any disclaimer, the term of this patent is extended or adjusted under 35 U.S.C. 154(b) by 455 days.

(21) Appl. No.: 18/131,713

(22) Filed: Apr. 6, 2023

(65) Prior Publication Data

US 2023/0240443 A1 Aug. 3, 2023

Related U.S. Application Data

(63) Continuation of application No. 17/378,454, filed on Jul. 16, 2021, now Pat. No. 11,647,834.

(Continued)

(51) Int. Cl.
A47B 81/06 (2006.01)
F16M 11/04 (2006.01)
(Continued)

(52) U.S. Cl.
CPC ........... A47B 81/06 (2013.01); F16M 11/041 (2013.01); F16M 11/42 (2013.01); F16M 11/10 (2013.01);
(Continued)

(58) Field of Classification Search
CPC ...... F16M 11/041; F16M 11/42; F16M 13/02; F16M 11/10; F16M 2200/024; H05K 7/14; A47B 1/06
See application file for complete search history.

(56) References Cited

U.S. PATENT DOCUMENTS

| | | |
|---|---|---|
| 355,491 A | 1/1887 | Wiley |
| 734,509 A | 7/1903 | Caeser |
| | (Continued) | |

FOREIGN PATENT DOCUMENTS

| | | |
|---|---|---|
| AT | 336212 | 4/1977 |
| CN | 103277646 B | 9/2013 |
| | (Continued) | |

OTHER PUBLICATIONS

International Search Report and Written Opinion for related case No. PCT/US20/14589, dated Jun. 12, 2020, 24 pgs.
(Continued)

*Primary Examiner* — Monica E Millner
(74) *Attorney, Agent, or Firm* — Benesch Friedlander Coplan & Aronoff LLP

(57) ABSTRACT

A wall mount bracket assembly includes a first bracket having a vertical flange and a horizontal flange and a second bracket having a vertical flange and a horizontal flange. The horizontal flanges of the first and second bracket are adjustably coupled such that a gap defined between the vertical flanges of the first and second brackets may be varied, wherein the first and second brackets define a downwardly opening channel.

20 Claims, 26 Drawing Sheets

Related U.S. Application Data

(60) Provisional application No. 63/055,712, filed on Jul. 23, 2020.

(51) Int. Cl.
| | |
|---|---|
| *F16M 11/42* | (2006.01) |
| *F16M 11/10* | (2006.01) |
| *F16M 13/02* | (2006.01) |
| *H05K 7/14* | (2006.01) |

(52) U.S. Cl.
CPC ....... *F16M 13/02* (2013.01); *F16M 2200/024* (2013.01); *H05K 7/14* (2013.01)

(56) References Cited

U.S. PATENT DOCUMENTS

| | | | |
|---|---|---|---|
| 810,004 | A | 1/1906 | Tabler |
| 824,126 | A | 6/1906 | Little |
| 930,509 | A | 8/1909 | Warfield |
| 1,135,241 | A | 4/1915 | Woods |
| 1,487,500 | A | 3/1924 | Williams |
| 1,605,506 | A | 11/1926 | Brunhoff |
| 1,844,945 | A | 2/1932 | Collins |
| 1,955,509 | A | 4/1934 | Moeckel |
| 2,058,397 | A | 10/1936 | Baker |
| 2,143,235 | A | 1/1939 | Bessett |
| 2,187,087 | A | 1/1940 | Leary |
| 2,338,968 | A | 1/1944 | Robinson et al. |
| 2,417,244 | A | 3/1947 | Eggert et al. |
| 2,468,513 | A | 4/1949 | Rider |
| 2,520,450 | A | 8/1950 | Austin, Jr. |
| 2,599,380 | A | 6/1952 | Galvin |
| 2,618,033 | A | 11/1952 | Tinnerman et al. |
| 2,833,550 | A | 5/1958 | Frick |
| 2,838,351 | A | 6/1958 | Siconolfi et al. |
| 2,880,490 | A | 4/1959 | Rizzatti et al. |
| 2,902,239 | A | 9/1959 | Janecka, Jr. |
| 2,999,570 | A | 9/1961 | Seiz |
| 3,476,362 | A | 11/1969 | Thompson |
| 3,605,851 | A | 9/1971 | Miles et al. |
| 3,735,794 | A | 5/1973 | Lebowitz |
| 3,766,692 | A | 10/1973 | Stark et al. |
| 3,802,146 | A | 4/1974 | Tacke et al. |
| 3,809,142 | A | 5/1974 | Bleeker |
| 3,836,144 | A | 9/1974 | Mahoney |
| 3,874,035 | A | 4/1975 | Schuplin |
| 3,889,315 | A | 6/1975 | Stouffer |
| 3,949,827 | A | 4/1976 | Witherspoon |
| 3,987,836 | A | 10/1976 | LeMay |
| 4,034,463 | A | 7/1977 | Ryan |
| 4,036,465 | A | 7/1977 | Kellner |
| 4,104,838 | A | 8/1978 | Hage et al. |
| 4,190,375 | A | 2/1980 | Berry |
| 4,197,685 | A | 4/1980 | Goulish et al. |
| 4,213,493 | A | 7/1980 | Haworth |
| 4,215,765 | A | 8/1980 | Harris |
| D262,183 | S | 12/1981 | Brown et al. |
| 4,344,719 | A | 8/1982 | Thom |
| 4,383,487 | A | 5/1983 | Fitzner et al. |
| 4,398,841 | A | 8/1983 | Kojima et al. |
| 4,523,722 | A | 6/1985 | Cohen et al. |
| 4,559,738 | A | 12/1985 | Helfman |
| 4,635,410 | A | 1/1987 | Chumbley |
| 4,644,876 | A | 2/1987 | Thomas |
| 4,671,481 | A | 6/1987 | Beard |
| 4,684,425 | A | 8/1987 | Bannister |
| 4,711,183 | A | 12/1987 | Handler et al. |
| 4,740,010 | A | 4/1988 | Moszkovitz |
| 4,755,260 | A | 7/1988 | Sakuma |
| 4,824,064 | A | 4/1989 | Oncale |
| 4,928,116 | A | 5/1990 | Wood |
| 4,929,116 | A | 5/1990 | Mahl |
| 4,934,015 | A | 6/1990 | Mink |
| 4,947,601 | A | 8/1990 | McGuire |
| 4,971,281 | A | 11/1990 | Steinbeck |
| 4,989,688 | A | 2/1991 | Nelson |
| 4,991,368 | A | 2/1991 | Amstutz |
| D318,608 | S | 7/1991 | Schenker |
| 5,044,589 | A * | 9/1991 | Milne .................... A47H 1/124 |
| | | | 248/265 |
| 5,058,331 | A | 10/1991 | Epps |
| 5,083,390 | A | 1/1992 | Edman |
| 5,101,606 | A | 4/1992 | Meru |
| 5,129,202 | A | 7/1992 | Payne et al. |
| 5,141,192 | A | 8/1992 | Adams |
| 5,162,696 | A | 11/1992 | Goodrich |
| 5,164,853 | A | 11/1992 | Shimazaki |
| 5,394,658 | A | 3/1995 | Schreiner et al. |
| 5,413,408 | A | 5/1995 | Beck et al. |
| 5,419,522 | A | 5/1995 | Luecke et al. |
| 5,501,423 | A | 3/1996 | Roberts |
| 5,511,348 | A | 4/1996 | Cornell et al. |
| 5,529,273 | A * | 6/1996 | Benthin ................. A47H 1/142 |
| | | | 248/254 |
| 5,640,823 | A | 6/1997 | Bergeron et al. |
| 5,647,152 | A | 7/1997 | Miura |
| 5,664,752 | A * | 9/1997 | Matthiessen ....... F16M 11/2021 |
| | | | 248/299.1 |
| 5,806,943 | A | 9/1998 | Dell et al. |
| 5,820,289 | A | 10/1998 | Kern et al. |
| 5,867,236 | A | 2/1999 | Babuka et al. |
| 5,875,578 | A | 3/1999 | Grewe |
| 5,878,518 | A | 3/1999 | Grewe |
| D408,716 | S | 4/1999 | Vesledahl |
| 5,899,035 | A | 5/1999 | Waalkes et al. |
| 5,921,402 | A | 7/1999 | Magenheimer |
| 5,941,713 | A | 8/1999 | Wayner et al. |
| 5,970,669 | A | 10/1999 | Livingston |
| 6,003,803 | A | 12/1999 | Knapp et al. |
| 6,029,833 | A | 2/2000 | Yeh |
| 6,050,033 | A | 4/2000 | Wrightman |
| 6,079,173 | A | 6/2000 | Waalkes et al. |
| 6,092,771 | A | 7/2000 | Fich |
| 6,112,472 | A | 9/2000 | Van Dyk et al. |
| 6,116,326 | A | 9/2000 | Domina et al. |
| 6,129,101 | A | 10/2000 | Dubinsky |
| 6,134,844 | A | 10/2000 | Cornell et al. |
| 6,141,926 | A | 11/2000 | Rossiter et al. |
| 6,173,933 | B1 | 1/2001 | Whiteside et al. |
| 6,240,687 | B1 | 6/2001 | Chong |
| 6,257,797 | B1 | 7/2001 | Lange |
| 6,272,779 | B1 | 8/2001 | Seiber et al. |
| 6,337,724 | B1 | 1/2002 | Itoh et al. |
| 6,349,516 | B1 | 2/2002 | Powell et al. |
| 6,357,960 | B1 | 3/2002 | Cornelius et al. |
| 6,467,745 | B1 * | 10/2002 | Sickels .................. H04R 1/026 |
| | | | 248/242 |
| 6,490,829 | B1 | 12/2002 | Schreiner et al. |
| 6,505,801 | B2 | 1/2003 | Zerres |
| 6,530,545 | B2 | 3/2003 | Deciry et al. |
| 6,556,762 | B1 | 4/2003 | Erickson et al. |
| 6,561,366 | B2 | 5/2003 | Kim-So |
| 6,615,523 | B1 | 9/2003 | Curbelo et al. |
| 6,639,643 | B2 | 10/2003 | Babuka et al. |
| D482,269 | S | 11/2003 | Martello |
| 6,643,942 | B1 | 11/2003 | Russell |
| 6,647,652 | B1 | 11/2003 | Seiber et al. |
| 6,681,529 | B1 | 1/2004 | Baloga et al. |
| 6,719,260 | B1 | 4/2004 | Hart |
| 6,729,085 | B2 | 5/2004 | Newhouse et al. |
| 6,732,660 | B2 | 5/2004 | Dame et al. |
| 6,802,480 | B1 | 10/2004 | Martello |
| 6,874,971 | B2 | 4/2005 | Albaugh |
| 6,877,442 | B2 | 4/2005 | Helle |
| 6,880,259 | B1 | 4/2005 | Schultz |
| 6,918,212 | B1 | 7/2005 | Anderson, Sr. |
| 6,935,523 | B2 | 8/2005 | Ahn |
| 6,955,130 | B2 | 10/2005 | Phillips |
| 7,007,903 | B2 | 3/2006 | Turner |
| 7,007,905 | B2 | 3/2006 | Roberts |
| 7,026,551 | B2 | 4/2006 | Franz et al. |
| 7,097,143 | B2 | 8/2006 | Kim et al. |
| D529,792 | S | 10/2006 | Klein et al. |
| 7,121,796 | B2 | 10/2006 | Burdgick et al. |

(56) References Cited

U.S. PATENT DOCUMENTS

| | | | |
|---|---|---|---|
| 7,175,152 B2 * | 2/2007 | Dittmer | F16M 13/02 |
| | | | 248/222.51 |
| D539,636 S | 4/2007 | Bremmon | |
| 7,226,024 B2 | 6/2007 | Lin | |
| 7,232,234 B2 | 6/2007 | Branham et al. | |
| 7,243,892 B2 | 7/2007 | Pfister | |
| 7,249,624 B2 | 7/2007 | Zeh et al. | |
| 7,317,613 B2 | 1/2008 | Quijano et al. | |
| 7,325,343 B2 | 2/2008 | Seiber et al. | |
| 7,404,535 B2 | 7/2008 | Mossman et al. | |
| 7,455,278 B2 | 11/2008 | Hsu | |
| D598,272 S | 8/2009 | Tejszerski | |
| 7,584,563 B2 | 9/2009 | Hillstrom et al. | |
| 7,611,109 B2 | 11/2009 | Lin | |
| 7,621,544 B2 | 11/2009 | Rossini | |
| D608,183 S | 1/2010 | Meyer et al. | |
| 7,661,640 B2 | 2/2010 | Persson | |
| 7,708,252 B2 | 5/2010 | Vander Berg et al. | |
| 7,748,196 B2 | 7/2010 | Gula et al. | |
| 7,797,869 B2 | 9/2010 | Tollis | |
| 7,823,857 B2 | 11/2010 | Stengel et al. | |
| 7,827,920 B2 | 11/2010 | Beck et al. | |
| 7,856,732 B2 | 12/2010 | Townsend et al. | |
| 7,862,341 B2 | 1/2011 | Durand et al. | |
| 7,882,600 B2 | 2/2011 | Judd | |
| 7,891,614 B2 | 2/2011 | Czajor | |
| 7,922,133 B2 | 4/2011 | Hsu | |
| 7,934,596 B1 | 5/2011 | Aycock | |
| 7,941,951 B2 | 5/2011 | Hillstrom et al. | |
| 7,996,980 B2 | 8/2011 | Hillstrom et al. | |
| 8,007,121 B2 | 8/2011 | Elliott et al. | |
| 8,070,121 B2 | 12/2011 | Dozier et al. | |
| 8,087,180 B1 | 1/2012 | Clayton | |
| 8,104,205 B2 | 1/2012 | Hillstrom et al. | |
| D657,054 S | 4/2012 | Bacon | |
| D663,190 S | 7/2012 | Mota et al. | |
| 8,220,758 B2 | 7/2012 | Czajor | |
| 8,245,992 B2 | 8/2012 | Matsui | |
| 8,250,774 B2 | 8/2012 | Townsend et al. | |
| 8,276,864 B2 | 10/2012 | Ye et al. | |
| 8,286,977 B2 | 10/2012 | Butler et al. | |
| 8,376,581 B2 | 2/2013 | Auld et al. | |
| 8,439,323 B1 | 5/2013 | Bae et al. | |
| 8,474,835 B1 | 7/2013 | Rossi | |
| D699,549 S | 2/2014 | Giessmann et al. | |
| D700,406 S | 2/2014 | Ashbreck | |
| 8,667,742 B2 | 3/2014 | Bates et al. | |
| 8,696,229 B2 | 4/2014 | Tran | |
| 8,727,290 B1 | 5/2014 | De La Matta et al. | |
| 8,824,166 B2 | 9/2014 | Rohrbach | |
| 8,833,713 B2 | 9/2014 | Kitaguchi | |
| 8,910,804 B2 | 12/2014 | Kim et al. | |
| 8,947,869 B2 | 2/2015 | Tsai et al. | |
| 8,979,049 B2 | 3/2015 | Yoshida | |
| 9,003,683 B1 | 4/2015 | Feliciano et al. | |
| 9,013,367 B2 | 4/2015 | Cope | |
| 9,039,016 B2 | 5/2015 | Abernethy et al. | |
| 9,057,479 B2 | 6/2015 | Lee | |
| 9,058,755 B2 | 6/2015 | Cope et al. | |
| 9,071,809 B2 | 6/2015 | Cope et al. | |
| 9,097,008 B2 | 8/2015 | Jung et al. | |
| 9,109,742 B2 | 8/2015 | Smith | |
| 9,119,303 B2 | 8/2015 | Baik et al. | |
| 9,119,487 B2 | 9/2015 | Angvall et al. | |
| 9,140,405 B2 | 9/2015 | Prince et al. | |
| 9,159,707 B2 | 10/2015 | Cope | |
| 9,166,385 B2 | 10/2015 | Newman | |
| D744,187 S | 11/2015 | Behar et al. | |
| 9,175,801 B2 | 11/2015 | Adilman et al. | |
| 9,189,015 B2 | 11/2015 | Tseng et al. | |
| 9,255,440 B2 | 2/2016 | Alexander et al. | |
| 9,261,122 B2 | 2/2016 | Choy | |
| 9,262,947 B2 | 2/2016 | Ranger | |
| 9,279,573 B1 | 3/2016 | Perez-Bravo et al. | |
| 9,377,153 B2 | 6/2016 | Zhang et al. | |
| 9,377,154 B2 | 6/2016 | Hung et al. | |
| 9,377,156 B2 | 6/2016 | Wong | |
| 9,386,860 B2 | 7/2016 | Brannan | |
| 9,388,933 B2 | 7/2016 | Zhang et al. | |
| 9,404,644 B1 | 8/2016 | Perez-Bravo et al. | |
| 9,406,248 B2 | 8/2016 | Dalton | |
| 9,430,181 B2 | 8/2016 | Dunn et al. | |
| 9,435,518 B2 | 9/2016 | Cope et al. | |
| 9,448,757 B2 | 9/2016 | Kim et al. | |
| 9,449,538 B2 | 9/2016 | Davis et al. | |
| 9,474,369 B1 | 10/2016 | Tsai | |
| 9,532,663 B2 | 1/2017 | Nilsson | |
| 9,535,649 B2 | 1/2017 | Cope et al. | |
| 9,567,776 B2 | 2/2017 | Moock et al. | |
| 9,605,793 B2 | 3/2017 | Shibata | |
| 9,625,091 B1 | 4/2017 | Massey | |
| 9,640,516 B2 | 5/2017 | Cope | |
| 9,695,872 B2 | 7/2017 | Higashi | |
| 9,695,972 B1 | 7/2017 | Jiang et al. | |
| 9,695,992 B2 | 7/2017 | Schadt et al. | |
| 9,709,215 B2 | 7/2017 | Yoo et al. | |
| 9,741,270 B2 | 8/2017 | Zaccai et al. | |
| 9,754,518 B2 | 9/2017 | Perez-Bravo et al. | |
| 9,782,004 B2 | 10/2017 | Yu et al. | |
| 9,831,223 B2 | 11/2017 | Cope | |
| 9,854,701 B2 | 12/2017 | Choi et al. | |
| 9,894,988 B2 | 2/2018 | Olander | |
| 10,794,533 B1 * | 10/2020 | Correll | H05K 7/1474 |
| 11,000,125 B2 * | 5/2021 | Patrick | A47B 43/00 |
| 11,060,660 B2 * | 7/2021 | Fehr | F16M 13/022 |
| 2001/0030272 A1 | 10/2001 | Veazey | |
| 2002/0011193 A1 | 1/2002 | Beck et al. | |
| 2002/0011544 A1 | 1/2002 | Bosson | |
| 2002/0047073 A1 | 4/2002 | Deciry et al. | |
| 2002/0056794 A1 | 5/2002 | Ibrahim | |
| 2002/0124426 A1 | 9/2002 | Dewberry | |
| 2003/0029972 A1 | 2/2003 | Rodgers | |
| 2003/0066936 A1 | 4/2003 | Beck et al. | |
| 2003/0163958 A1 | 9/2003 | Zeh et al. | |
| 2004/0216911 A1 | 11/2004 | Franz et al. | |
| 2005/0201087 A1 | 9/2005 | Ward | |
| 2006/0016735 A1 | 1/2006 | Ito et al. | |
| 2006/0204675 A1 | 9/2006 | Gao et al. | |
| 2006/0291152 A1 | 12/2006 | Bremmon | |
| 2007/0007412 A1 | 1/2007 | Wang | |
| 2007/0018062 A1 | 1/2007 | Calinescu | |
| 2008/0073471 A1 | 3/2008 | Beger | |
| 2008/0083865 A1 | 4/2008 | Matsui | |
| 2008/0156949 A1 | 7/2008 | Sculler et al. | |
| 2008/0190951 A1 | 8/2008 | Gallagher et al. | |
| 2008/0297015 A1 | 12/2008 | Hagar et al. | |
| 2009/0002723 A1 | 1/2009 | Kamiyama et al. | |
| 2009/0101777 A1 | 4/2009 | Kim | |
| 2009/0206214 A1 | 8/2009 | David | |
| 2009/0252570 A1 | 10/2009 | Lee | |
| 2009/0266958 A1 | 10/2009 | Meersman et al. | |
| 2010/0011602 A1 | 1/2010 | Houssian et al. | |
| 2010/0038501 A1 | 2/2010 | Oh | |
| 2010/0176266 A1 | 7/2010 | Minkley et al. | |
| 2010/0271287 A1 | 10/2010 | Bourne et al. | |
| 2011/0079687 A1 | 4/2011 | Grove | |
| 2011/0233346 A1 | 9/2011 | Schluter | |
| 2011/0260026 A1 | 10/2011 | Ye et al. | |
| 2012/0162870 A1 | 6/2012 | MacDonald et al. | |
| 2013/0075551 A1 | 3/2013 | Stifal et al. | |
| 2013/0168335 A1 | 7/2013 | Gillespie | |
| 2013/0243231 A1 | 9/2013 | Parraga Gimeno | |
| 2013/0256487 A1 | 10/2013 | Ko | |
| 2013/0306816 A1 | 11/2013 | Yoshida | |
| 2014/0026788 A1 | 1/2014 | Kallio, III et al. | |
| 2014/0138506 A1 | 5/2014 | Dahl et al. | |
| 2014/0265193 A1 | 9/2014 | Stark | |
| 2014/0360412 A1 | 12/2014 | Zaccai et al. | |
| 2016/0115732 A1 | 4/2016 | Alexander et al. | |
| 2016/0120309 A1 | 5/2016 | Brandt et al. | |
| 2016/0210886 A1 | 7/2016 | Brashnyk et al. | |
| 2016/0328532 A1 | 11/2016 | Rieder et al. | |
| 2017/0059087 A1 | 3/2017 | Lam et al. | |
| 2017/0186345 A1 | 6/2017 | Hemphill et al. | |

(56)                  References Cited

U.S. PATENT DOCUMENTS

| | | | |
|---|---|---|---|
| 2017/0261154 A1 | 9/2017 | Feldman | |
| 2017/0345350 A1 | 11/2017 | Topousis et al. | |
| 2018/0252357 A1 | 9/2018 | Kahn | |
| 2020/0245488 A1 | 7/2020 | Iacovoni et al. | |
| 2021/0310610 A1* | 10/2021 | Fehr | F16B 2/065 |

FOREIGN PATENT DOCUMENTS

| | | |
|---|---|---|
| CN | 204309378 U | 5/2015 |
| CN | 204423716 U | 6/2015 |
| CN | 105743030 A | 7/2016 |
| CN | 205371981 U | 7/2016 |
| CN | 205534961 U | 8/2016 |
| CN | 206831093 U | 1/2018 |
| DE | 29 50 742 A1 | 6/1981 |
| DE | 3617445 A1 | 5/1988 |
| DE | 9312696 U1 | 1/1995 |
| DE | 296 17 770 U1 | 1/1997 |
| DE | 299 13 965 U1 | 12/1999 |
| DE | 198 38 722 A1 | 3/2000 |
| DE | 200 17 972 U1 | 2/2001 |
| DE | 199 51 695 A1 | 5/2001 |
| DE | 20 2010 009 779 U1 | 10/2010 |
| DE | 102014107965 A1 | 12/2015 |
| DE | 10 2014 112 177 A1 | 3/2016 |
| DE | 10 2015 010 162 A1 | 2/2017 |
| DE | 10 2009 011 845 B4 | 7/2017 |
| EP | 0 050 241 B1 | 4/1982 |
| EP | 1 134 325 A1 | 9/2001 |
| EP | 2 083 208 B1 | 6/2011 |
| EP | 2 369 219 A2 | 9/2011 |
| EP | 2 369 219 A3 | 4/2012 |
| FR | 2464342 | 8/1979 |
| FR | 2 694 608 B1 | 2/1994 |
| GB | 654890 | 7/1951 |
| GB | 936145 | 9/1963 |
| GB | 1124359 | 8/1968 |
| GB | 2 129 028 A | 5/1984 |
| GB | 2 443 159 A | 4/2008 |
| GB | 2 528 029 A | 1/2016 |
| JP | 11201386 | 7/1999 |
| JP | 2016109147 A | 6/2016 |
| KR | 10-0930603 | 12/2009 |
| KR | 10 169 9669 | 1/2017 |
| NL | 2011365 | 9/2013 |
| SE | 355 647 | 4/1973 |
| WO | WO 2004/044471 A1 | 5/2004 |
| WO | WO-2006127826 A2 | 11/2006 |
| WO | WO 2011/133120 A1 | 10/2011 |
| WO | WO 2012/023898 A1 | 2/2012 |
| WO | WO 2015/161761 A1 | 10/2015 |
| WO | WO 2016/178621 A1 | 11/2016 |
| WO | WO 2016/178625 A1 | 11/2016 |
| WO | WO 2019/063960 A1 | 4/2019 |

OTHER PUBLICATIONS

International Search Report and Written Opinion for International Application No. PCT/US21/41386 mailed Nov. 22, 2021 (14 paqes).
Extended European Search Report for EP Patent Application No. 20745584.1 dated Sep. 22, 2022 (11 paqes).
Extended European Search Report for EP Application No. 21846429.5 mailed Jun. 27, 2024 (6 pages).

* cited by examiner

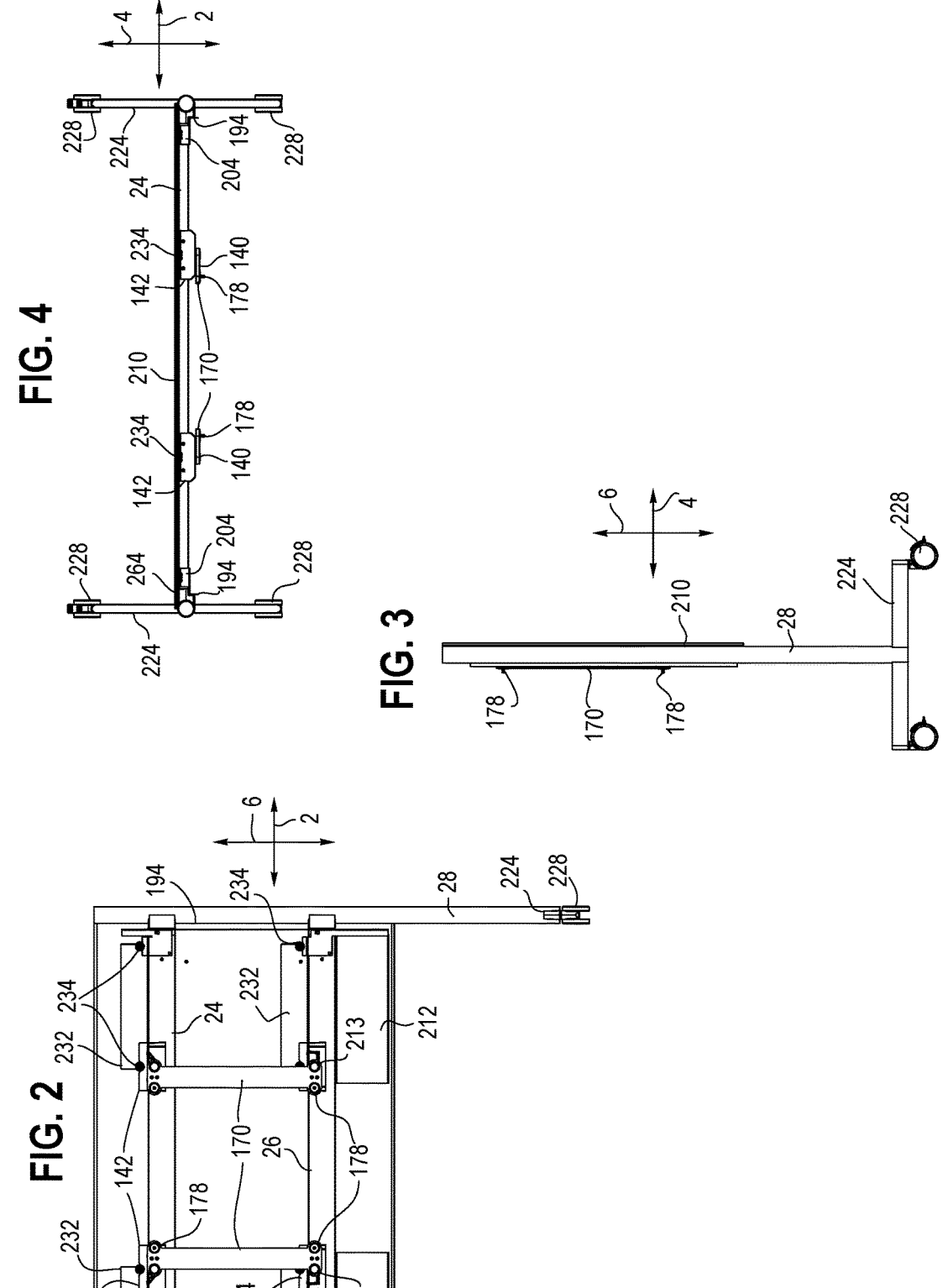

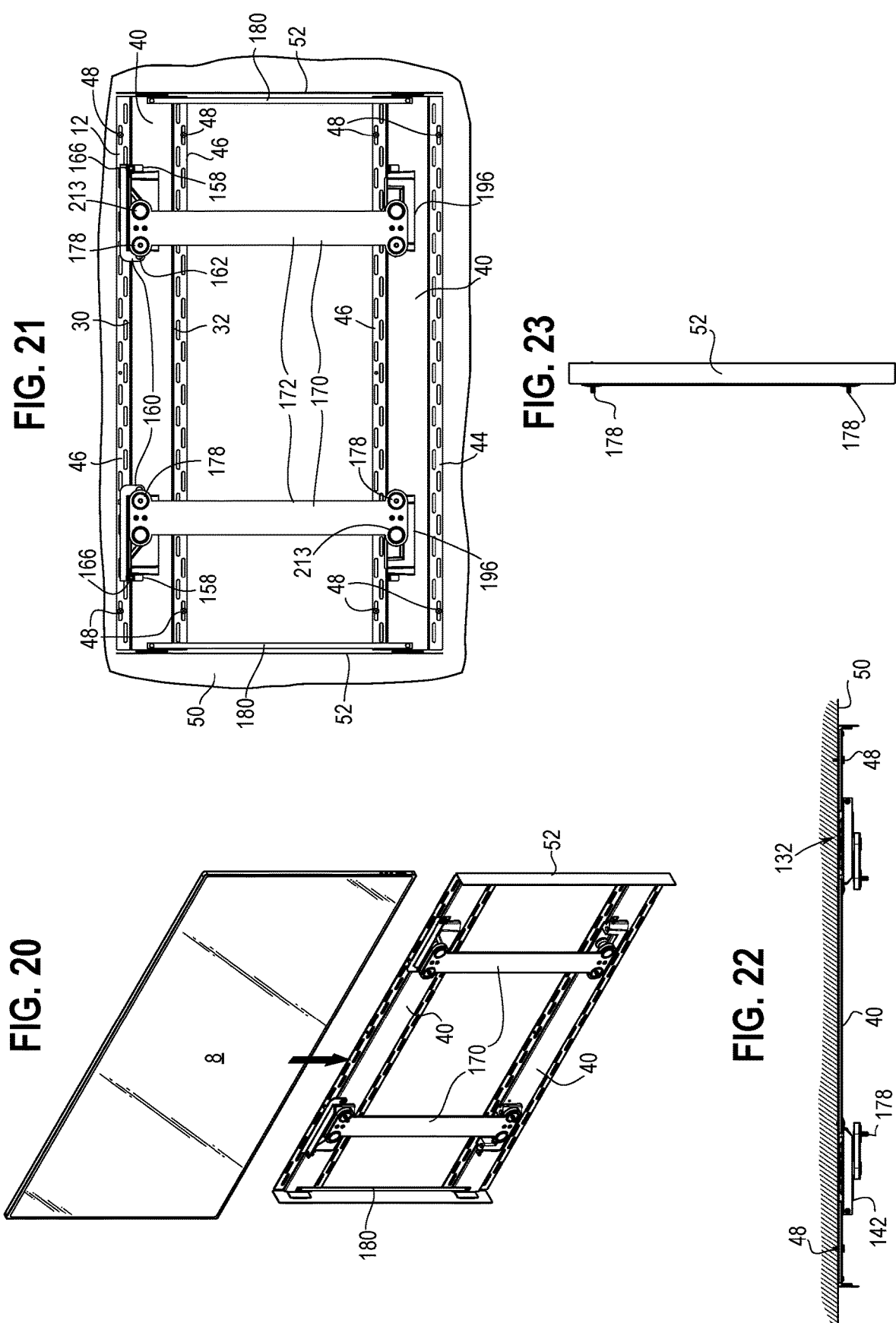

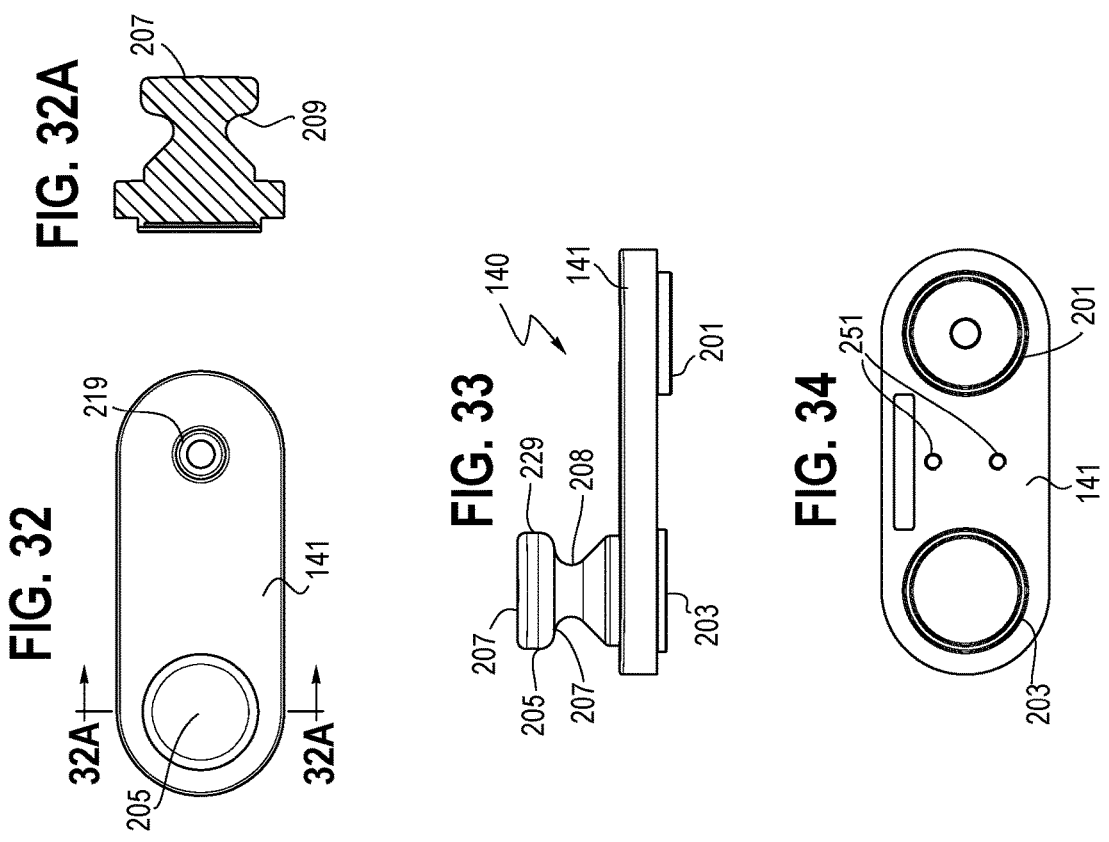
FIG. 32A
FIG. 32
FIG. 33
FIG. 34
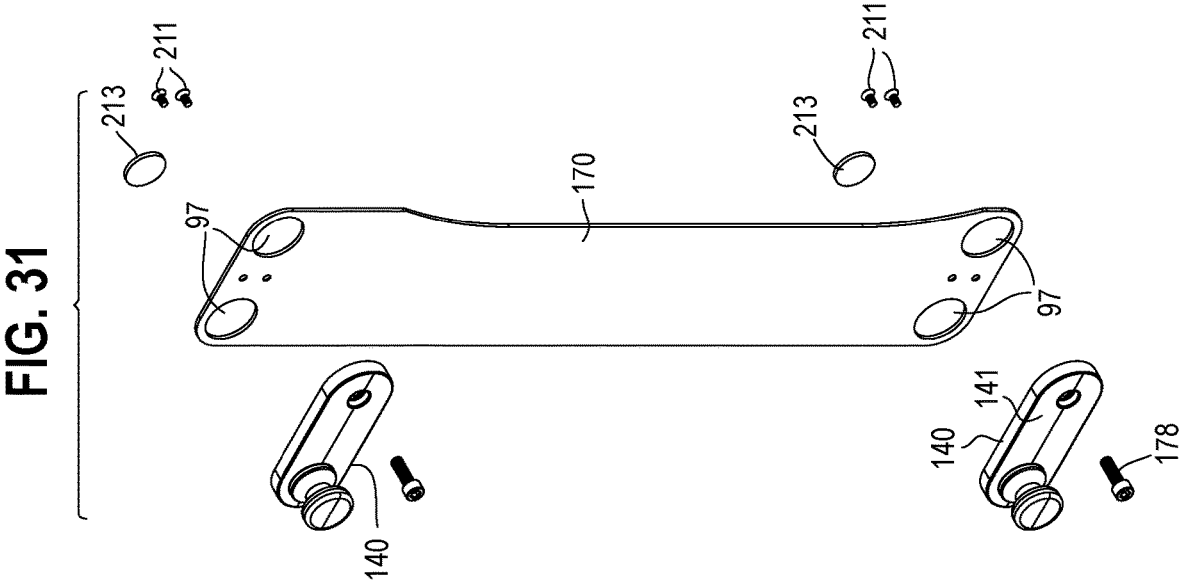
FIG. 31

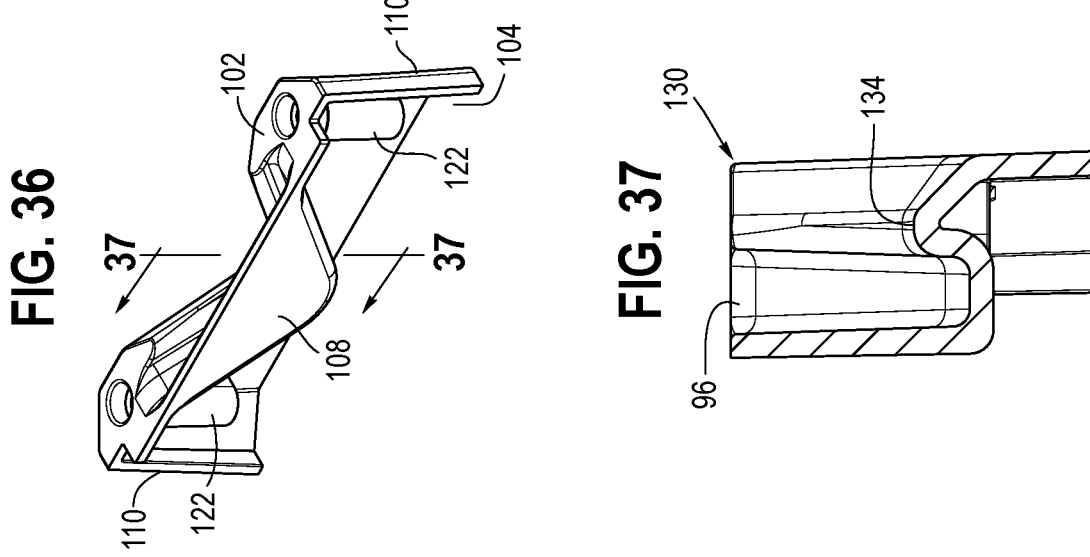
FIG. 35
FIG. 36
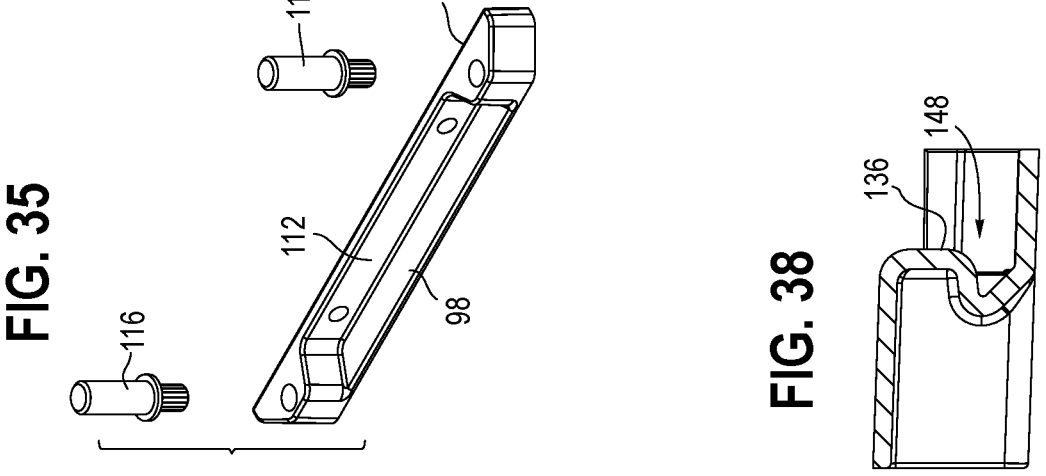
FIG. 38
FIG. 37

DISPLAY SUPPORT SYSTEM AND METHOD FOR THE USE THEREOF

DISPLAY SUPPORT SYSTEM AND METHOD
FOR THE USE THEREOF

This application is a continuation of U.S. application Ser. No. 17/378,454 filed Jul. 16, 2021 and entitled "Display Support System and Method for the Use Thereof," which application claims the benefit of U.S. Provisional Application No. 63/055,712, filed Jul. 23, 2020 and entitled "Display Support System and Method For the Use Thereof," the entire disclosures of which are hereby incorporated herein by reference.

FIELD OF THE INVENTION

The present disclosure relates generally to a display support system and components, and methods for the use, assembly and reconfiguration thereof.

BACKGROUND

Technology advances have allowed for larger electronic visual displays to become more commonplace. In various environments, it may be desirable to mount such displays to a wall, or to secure them to a cart to provide for mobility, or allow for the displays to be easily transitioned from one display support system to another. Such disparate mounting environments typically require different hardware, which requires additional inventory and installation configurations. In some environments, the supporting wall may not accommodate the weight of the display, while in other environments it may be desirable to make an electronic visual display portable, such that it may be easily moved to a desired viewing location. Often, carts that allow for such portability and may accommodate such visual displays are boxy and cumbersome, and are not configured to easily accommodate the displays. Moreover, the rear of the cart and display are often visible, with various cords and accessories associated with the display providing an unaesthetic appearance.

SUMMARY

The present invention is defined by the following claims, and nothing in this section should be considered to be a limitation on those claims.

In one aspect, one embodiment of a display support system includes a pair of posts spaced apart in a first direction and upper and lower vertically spaced beams extending in the first direction. Each of the upper and lower beams has first and second ends coupled to the posts. A pair of receivers are carried by each of the upper and lower beams, wherein the receivers open upwardly in a second direction orthogonal to the first direction, and wherein the receivers are movable relative to the upper and lower beams in at least the second direction. A plurality of mounting members, each having an insert portion, are removably received in one of the receivers, wherein the mounting members are adapted to be coupled to the display.

In another aspect, one embodiment of a display support system includes a beam extending in a horizontal direction and having a front and rear, wherein the beam includes a receiver defining a mouth. A mounting member includes an insert portion removably disposed in the mouth and a display mounting portion adapted to support the display on the front of the beam. A bracket is coupled to the beam and closes the mouth across the top of the insert portion. A screen is removably coupled to, or supported on, the bracket and is disposed along the rear of the beam.

In another aspect, one embodiment of a display support system includes a pair of cylindrical posts spaced apart in a first direction horizontal. Each of the posts includes at least one fastener hole disposed on each side of a vertical centerline. A beam includes first and second ends and first and second opposite sides spaced apart in a second horizontal direction. The beam extends between the posts, with the first and second ends coupled to the posts. Each of the first and second ends includes a stepped portion extending outwardly from the first side, with the stepped portion having a fastener opening extending in the first direction. A fastener extends through the fastener opening and engages one of the fastener openings in the post.

In another aspect, one embodiment of a wall mount bracket includes a first bracket having a vertical flange and a horizontal flange, and a second bracket having a vertical flange and a horizontal flange. The horizontal flanges of the first and second bracket overlap and are adjustably coupled such that a gap defined between the vertical flanges of the rear and front brackets may be varied. The first and second brackets define a downwardly opening channel.

In another aspect, one embodiment of a display support system includes a pair of tubular posts spaced apart in a first direction. At least one beam extends in the first direction and includes first and second ends coupled to the posts. A pair of feet are coupled to bottom ends of the posts and extend in a second direction transverse to the first direction. A counterweight ballast member is disposed in a bottom portion of at least one of the posts. In one embodiment, a second counterweight ballast member is disposed in at least one of the feet.

In another aspect, one embodiment of a display support system includes upper and lower vertically spaced beams extending in a horizontal direction. A pair of horizontally spaced receivers are carried by each of the upper and lower beams, wherein the receivers open upwardly, and wherein the receivers are vertically movable relative to the upper and lower beams. The receivers carried by the upper beam each include a V-shaped rim, while the receivers carried by the lower beam each include a horizontal rim. A plurality of mounting members each have an insert portion removably received in one of the receivers. The mounting members engage the rims of the receivers, and are adapted to be coupled to the display.

The various embodiments of the display support system, and methods for the configuration and use thereof, provide significant advantages over other display support systems, and components used therein. For example and without limitation, the display support system allows for a display to be quickly and easily mounted to the beams, in a plurality of mounting environments, while also providing for adjustment of the display at each mounting member. The mounting arrangements allow for the displays to be mounted to a wall or a cart, or alternatively to be supported on the floor while anchored to the wall. In the latter arrangement, a bracket system is provided to accommodate differently sized beams, and/or beams positioned at different distances from the wall. In the cart arrangement, a screen may be coupled to the cart and disposed over the rear of the cart to hide the rear of the display while also providing functionality to the system, for example by providing a tackable or writing surface. The screen may include a hinged door or access panel, for example and without limitation along a bottom of the screen.

The foregoing paragraphs have been provided by way of general introduction, and are not intended to limit the scope of the following claims. The various preferred embodiments, together with further advantages, will be best understood by reference to the following detailed description taken in conjunction with the accompanying drawings.

BRIEF DESCRIPTION OF THE DRAWINGS

FIG. 2 is a front view of the display support system shown in FIG. 1.

FIG. 3 is a side view of the display support system shown in FIG. 1.

FIG. 4 is a top view of the display support system shown in FIG. 1.

FIG. 20 is a perspective view of another embodiment of a display support assembly.

FIG. 21 is a front view of the display support assembly shown in FIG. 20.

FIG. 22 is a top view of the display support assembly shown in FIG. 20.

FIG. 23 is a side view of the display support assembly shown in FIG. 21.

FIG. 31 is an exploded perspective view of one embodiment of a display support.

FIG. 32 is a rear view of one embodiment of a mounting member.

FIG. 32A is cross-sectional view of the mounting member taken alone line 32A-32A in FIG. 32.

FIG. 33 is a top view of the mounting member shown in FIG. 32.

FIG. 34 is a front view of the mounting member shown in FIG. 32.

FIG. 35 is an exploded view of one embodiment of a support platform.

FIG. 36 is a rear perspective view of on embodiment of an upper receiver.

FIG. 37 is a cross-sectional view of the upper receiver taken along line 37-37 of FIG. 36.

FIG. 38 is a cross-sectional view of the lower receiver.

DETAILED DESCRIPTION OF THE PRESENTLY PREFERRED EMBODIMENTS

It should be understood that the term "plurality," as used herein, means two or more. The terms "longitudinal" as used herein means of or relating to length or the lengthwise direction 2, for example between the opposite ends of a beam, and may include a horizontal direction. The terms "lateral" and "transverse" as used herein, means situated on, directed toward or running from side to side, and refers to a lateral direction 4 transverse to the longitudinal direction. In one embodiment, the longitudinal and lateral directions correspond to the X and Z directions, both lying within a horizontal plane, with a vertical direction 6 running in the Y direction. The term "coupled" means connected to or engaged with whether directly or indirectly, for example with an intervening member, and does not require the engagement to be fixed or permanent, although it may be fixed or permanent (or integral), and includes both mechanical and electrical connection. The terms "first," "second," and so on, as used herein are not meant to be assigned to a particular component of feature so designated, but rather are simply referring to such components or features in the numerical order as addressed, meaning that a component or feature designated as "first" may later be a "second" such component or feature, depending on the order in which it is referred. For example, a "first" opening may be later referred to as a "second" opening depending on the order in which they are referred. It should also be understood that designation of "first" and "second" does not necessarily mean that the two components, features or values so designated are different, meaning for example a first opening may be the same as a second opening, with each simply being applicable to separate but identical features.

Displays

Figure 1:
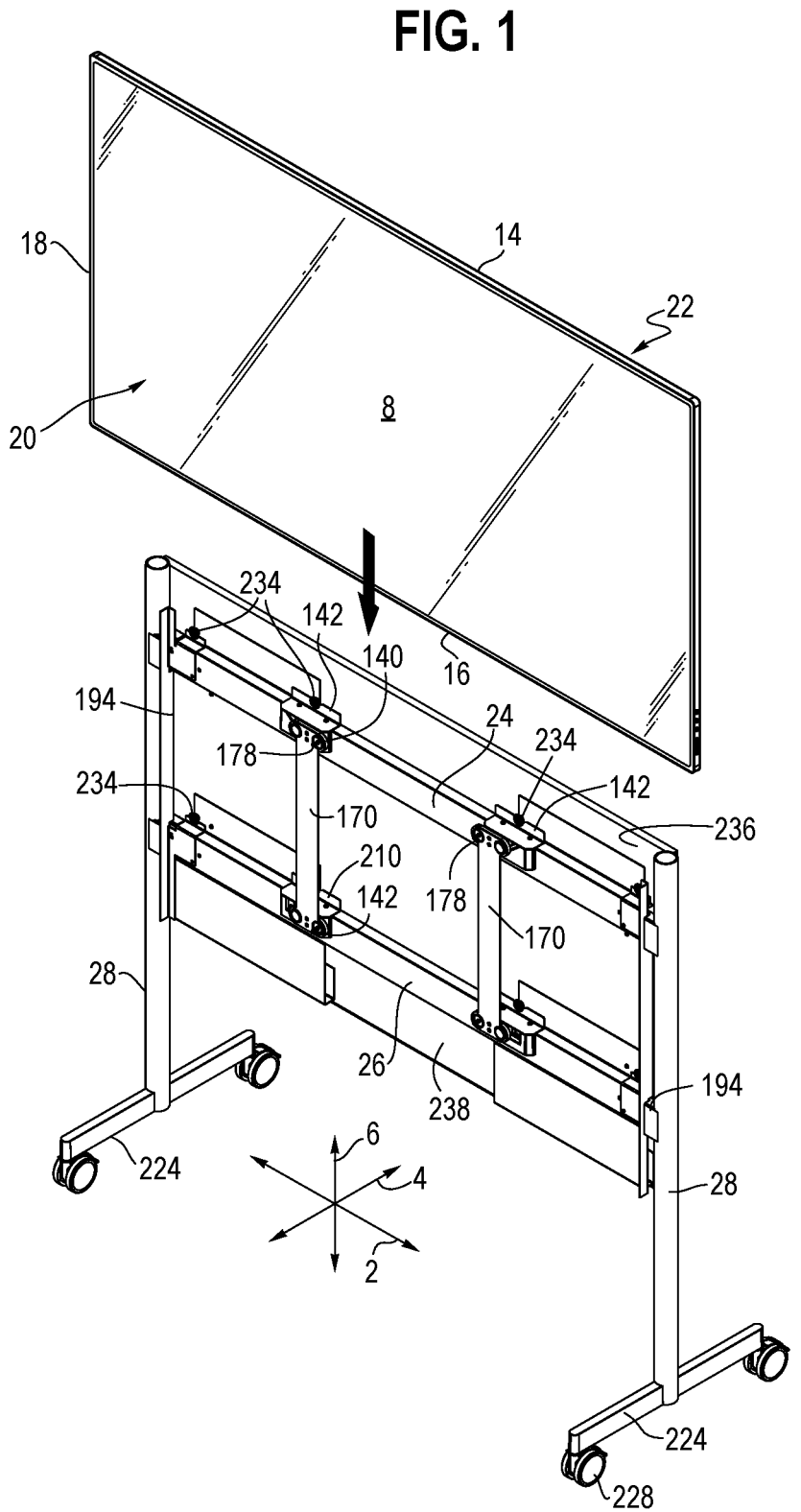
FIG. 1 is a front, perspective view of one embodiment of a display support system.
Figure 6:
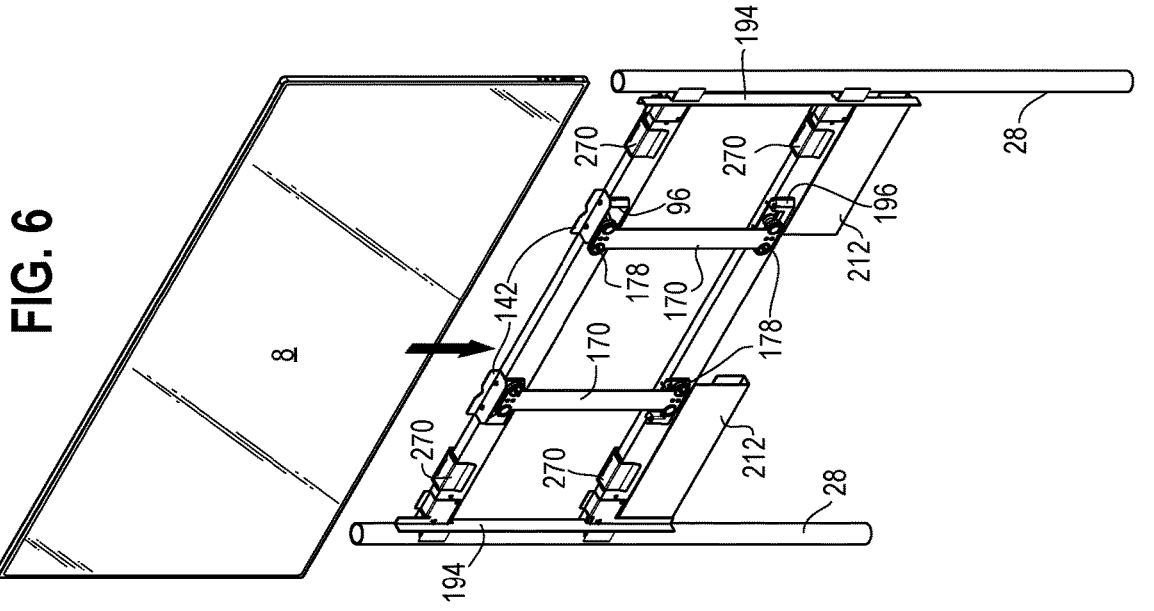
FIG. 6 is front, perspective view of another embodiment of a display support system.
Figure 9:
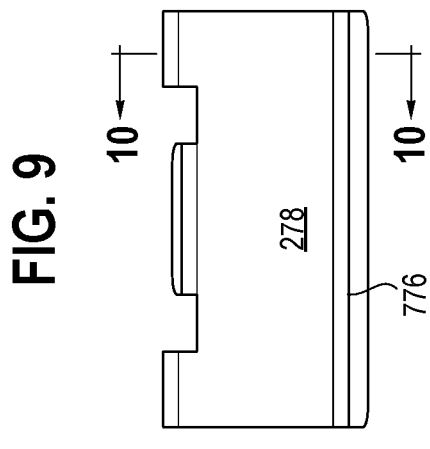
FIG. 9 is a top view of the bracket shown in FIG. 8.
Figure 11:
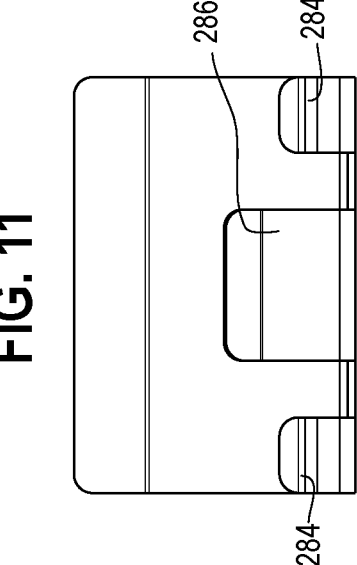
FIG. 11 is a rear view of the bracket shown in FIG. 9.
Figure 8:
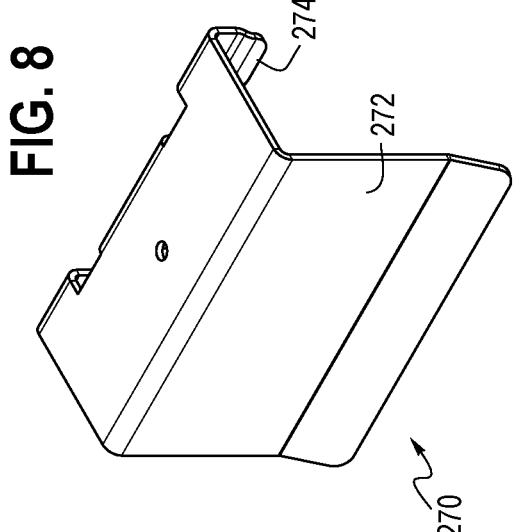
FIG. 8 is a perspective view of an engagement bracket.
Figure 10:
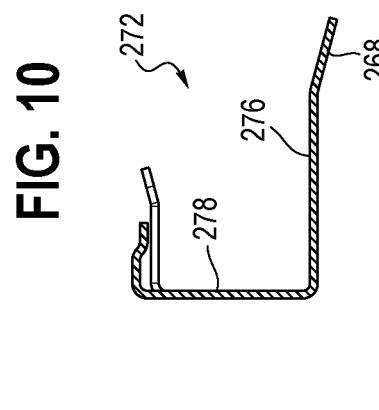
FIG. 10 is an end view of the bracket shown in FIG. 8.
Figures 12, 13, 14:
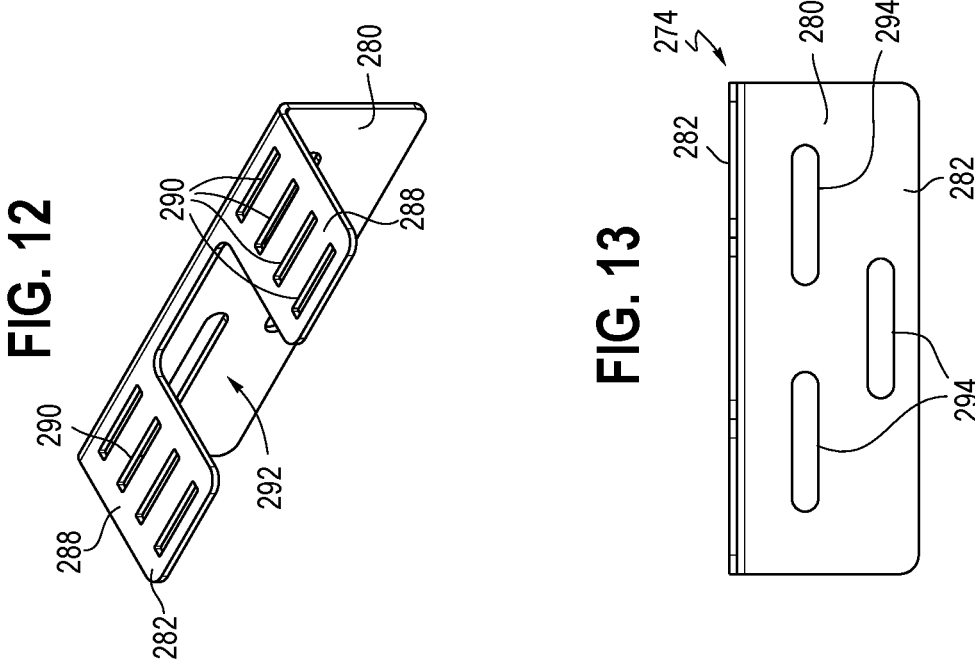
FIG. 12 is a perspective view of a wall bracket.
FIG. 13 is a rear view of the bracket show in FIG. 12.
FIG. 14 is a partial perspective view of a wall mount bracket assembly mounted to a wall and engaging a beam.

Referring to FIGS. 1, 6 and 20, an electronic visual display 8 may be secured to one more of the display support system embodiments. In one embodiment, each display 8 has a rectangular shape, with a top 14, a bottom 16, opposite sides 18, a front surface 20 and a rear surface 22. The front surface 20 may be configured as a user interface, including a touch sensitive screen. In other embodiments, the display may be configured in different shapes and sizes. In the embodiment shown, the display is arranged with a longer dimension extending in the horizontal direction 2. In other embodiments, the longer dimension may be arranged in the vertical, Y direction 6. In one embodiment, the displays 8 are rotatably supported about a horizontal axis extending in the Z-direction, or lateral direction 4, such that the orientation of the displays may be changed from a horizontal to a vertical orientation. In other embodiments, a plurality of displays may be coupled to the display support system.

Support Beams

Referring to FIGS. 1-7, 15-17, 19, 39 and 40, first and second, or upper and lower beams 24, 26, otherwise referred to as rails, may be secured to a pair of support posts 28. Each of the support beams 26, 62 is elongated in the longitudinal direction 2 and is positioned horizontally in one embodiment. It should be understood that the support beams may be positioned in non-horizontal orientations. Each support beam 24, 26 has a top 30, a bottom 32, a front 34 and a rear 36, which form an interior cavity 38 in combination. In one embodiment, the support beams 24, 26 are configured as tubes. The tubes have a rectangular cross-section in one embodiment, although the tubes may have other cross-sectional shapes.

In an alternative embodiment, shown in FIGS. 20-25, 42 and 44, the beam 40 does not have a rear wall, but rather is configured with vertical flanges 42, 44 extend upwardly and downwardly from the top and bottom walls 30, 32 of the beam, with the flanges including openings 46, e.g., elongated openings, shaped to receive fasteners 48 that secure the support beams directly to a wall 50. In one embodiment, the beams 40 have a hat shaped cross section. When the support beam 40 is fastened to the wall, the wall 50 closes off a far, or rear, side of the cavity 32 spaced laterally from the front side wall 34 in the lateral direction 4. Vertical trim pieces, or webs 52 are secured over and close off the ends of the beams 40. The webs are secured to flanges 53 extending forwardly from the ends of the beam, for example with adhesive or a magnetic pad.

Figure 42:
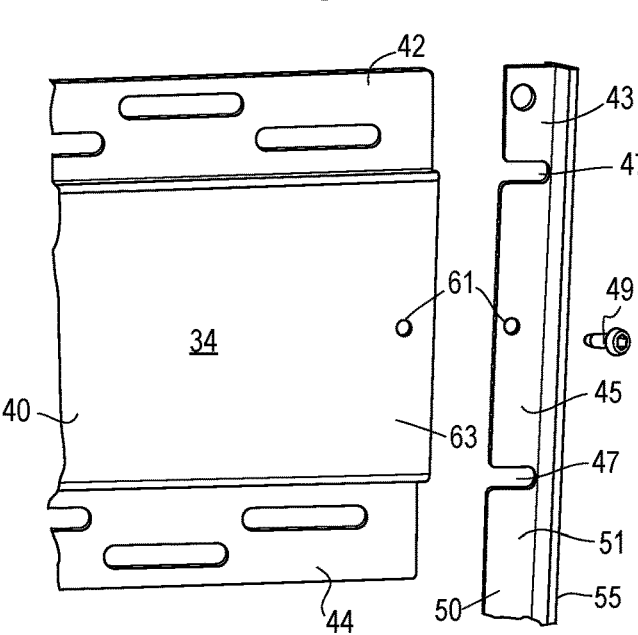
FIG. 42 is a partial view of a bracket secured to one embodiment of a support beam.
Figure 43:
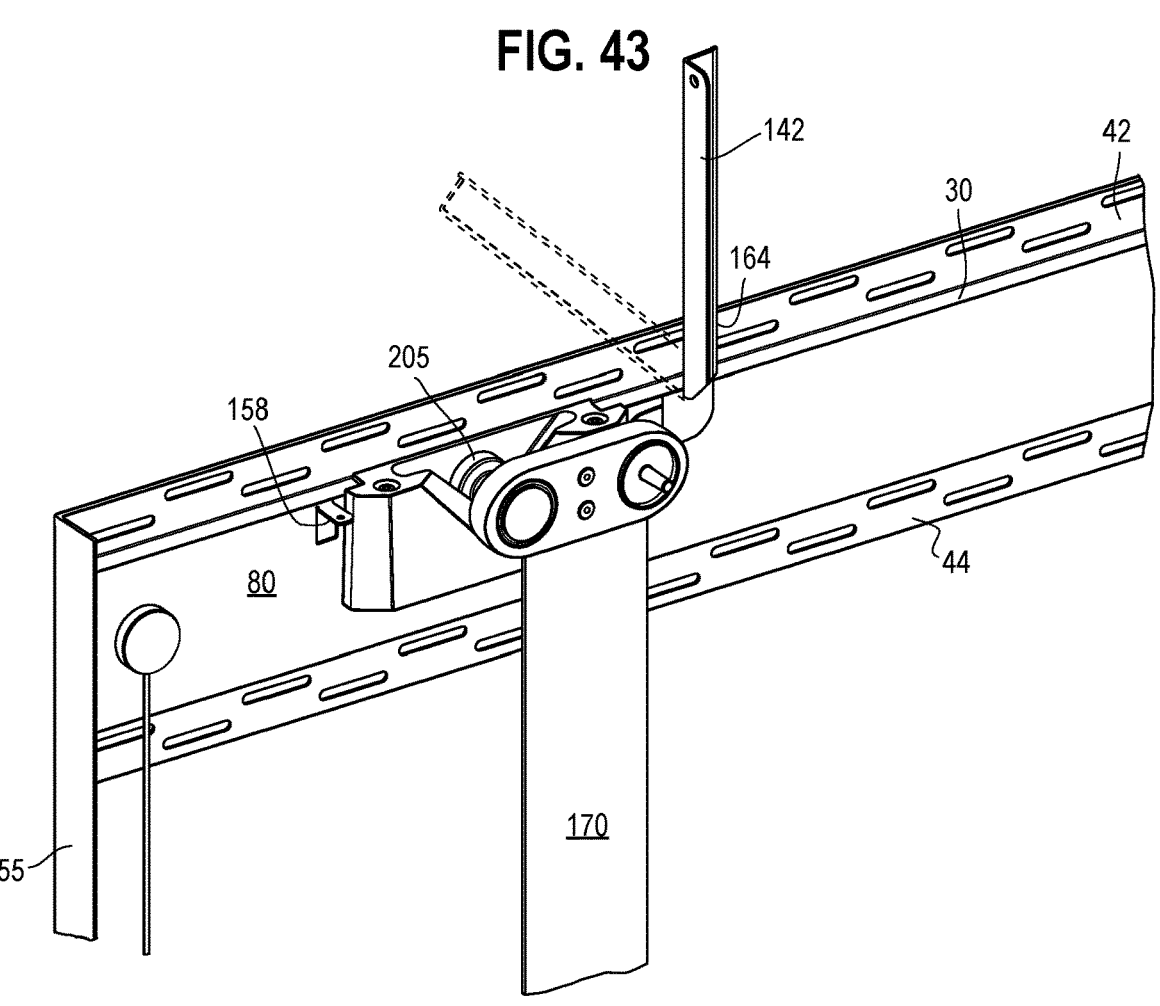
FIG. 43 is a partial view of a wall mounted display support system.

As shown in FIGS. 42 and 43, the vertical trim piece has an offset flanges 43, 45 separated by slots 47. The flanges 43 overlie flanges 42, 44, while the flange 45 underlines the wall 34. The flanges 43, 45 vertically positionally lock the trim piece relative to the beam. Because of this vertical positioning, the trim piece may function as a spacer 51 for the upper and lower beams. A lower end of the spacer is likewise secured to the other beam with flanges 43, 45 interfacing with flange 42, 44 and wall 34, which may thereafter be secured to the wall 34 with fasteners 48, which eliminates the need to level, measure and locate the second beam relative to the first beam. In this way, the beams 40 are automatically located to be aligned with the mounting members 140. The trim piece/spacer also includes a side flange 55 that covers the openings at the ends of the beam and closes the space between the display and the wall. A fastener, such as Christmas tree fastener 49 extends through mating openings 61, 63 to lock the trim piece to the beams.

Figures 15, 16:
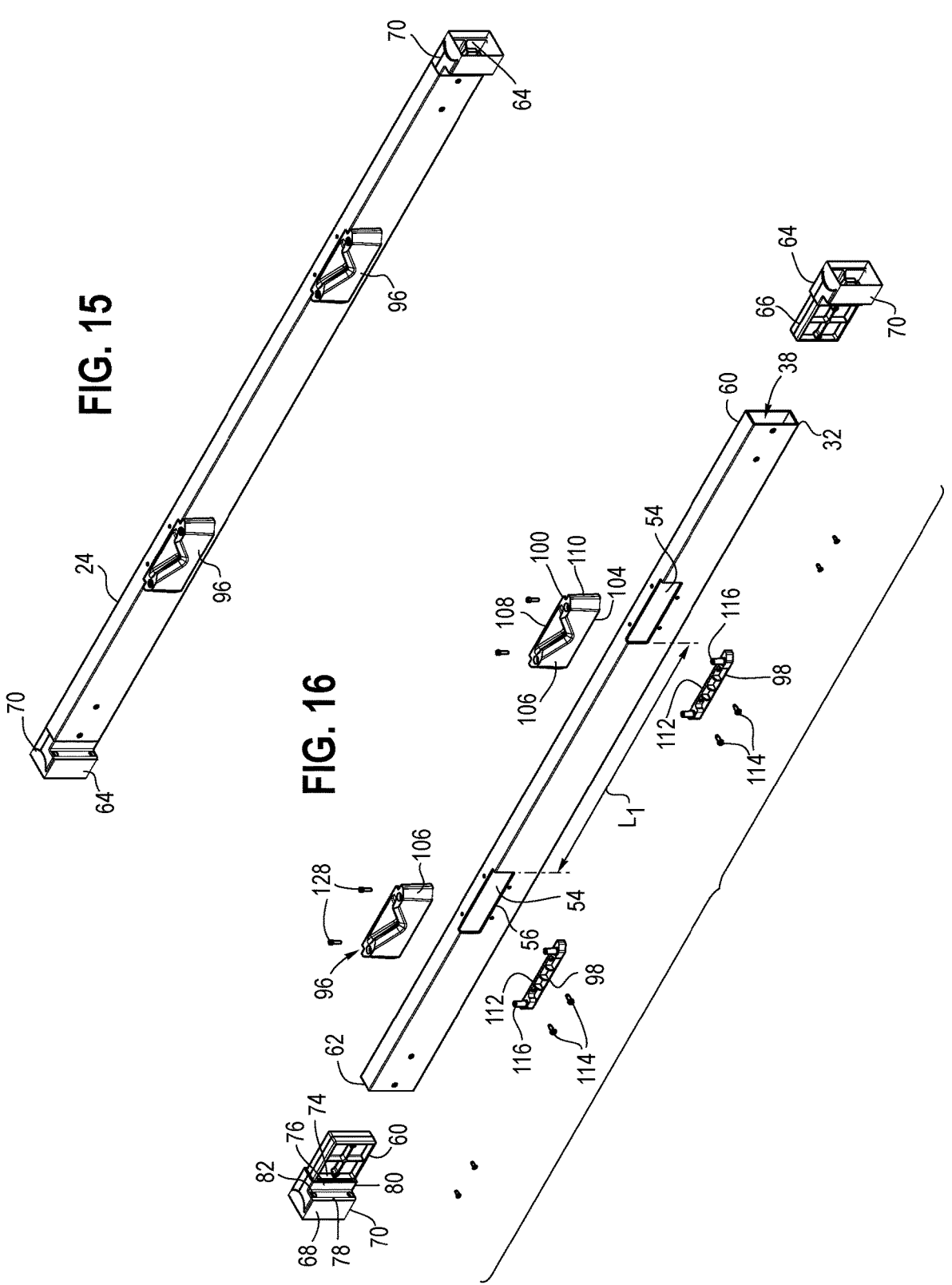
FIG. 15 is a perspective view of an upper beam.
FIG. 16 is an exploded perspective view of the upper beam shown in FIG. 15.
Figures 17, 18:
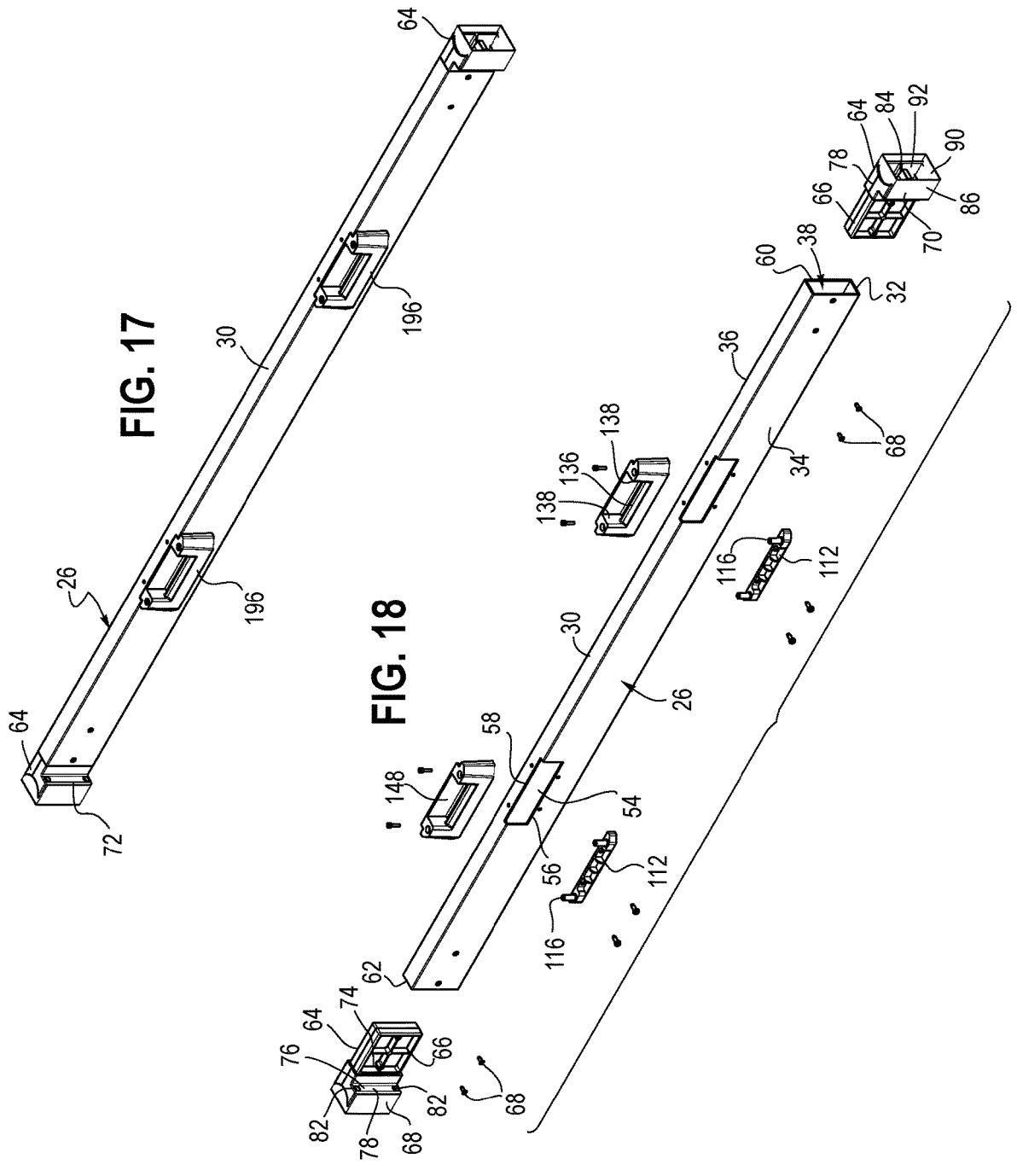
FIG. 17 is a perspective view of a lower beam.
FIG. 18 is an exploded perspective view of the lower beam shown in FIG. 17.
Figure 19:
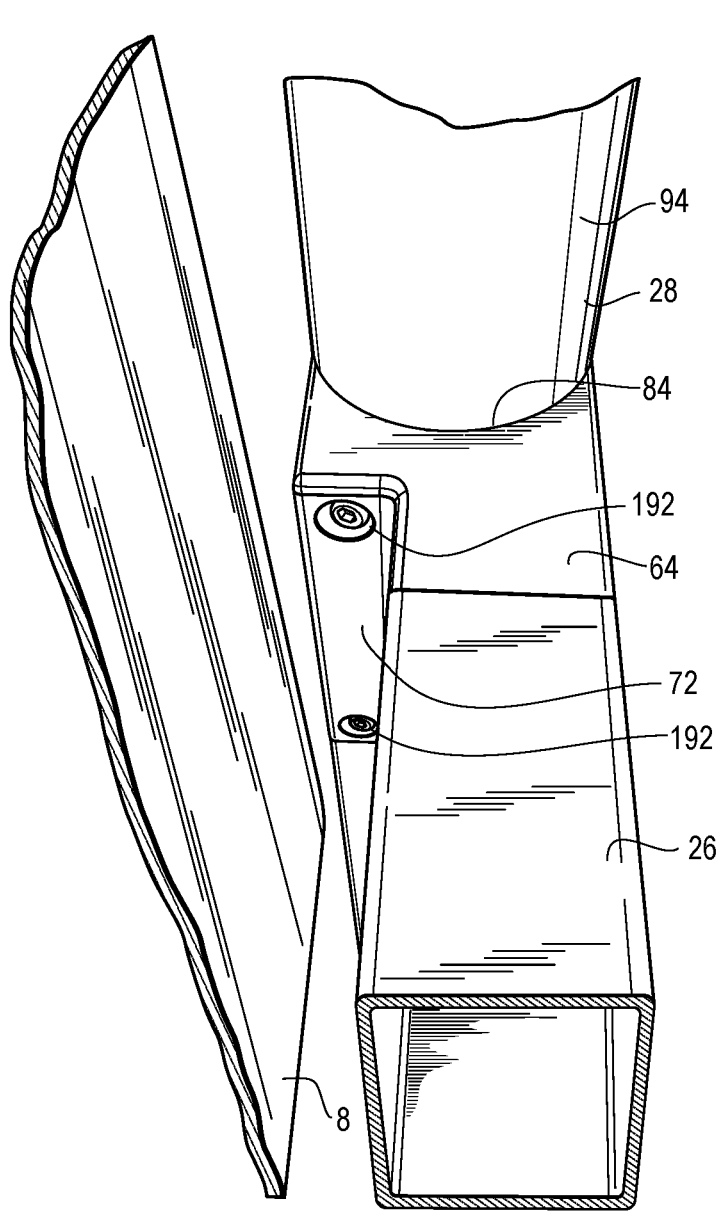
FIG. 19 is a partial top, perspective view showing a beam coupled to a support post.
Figure 24:
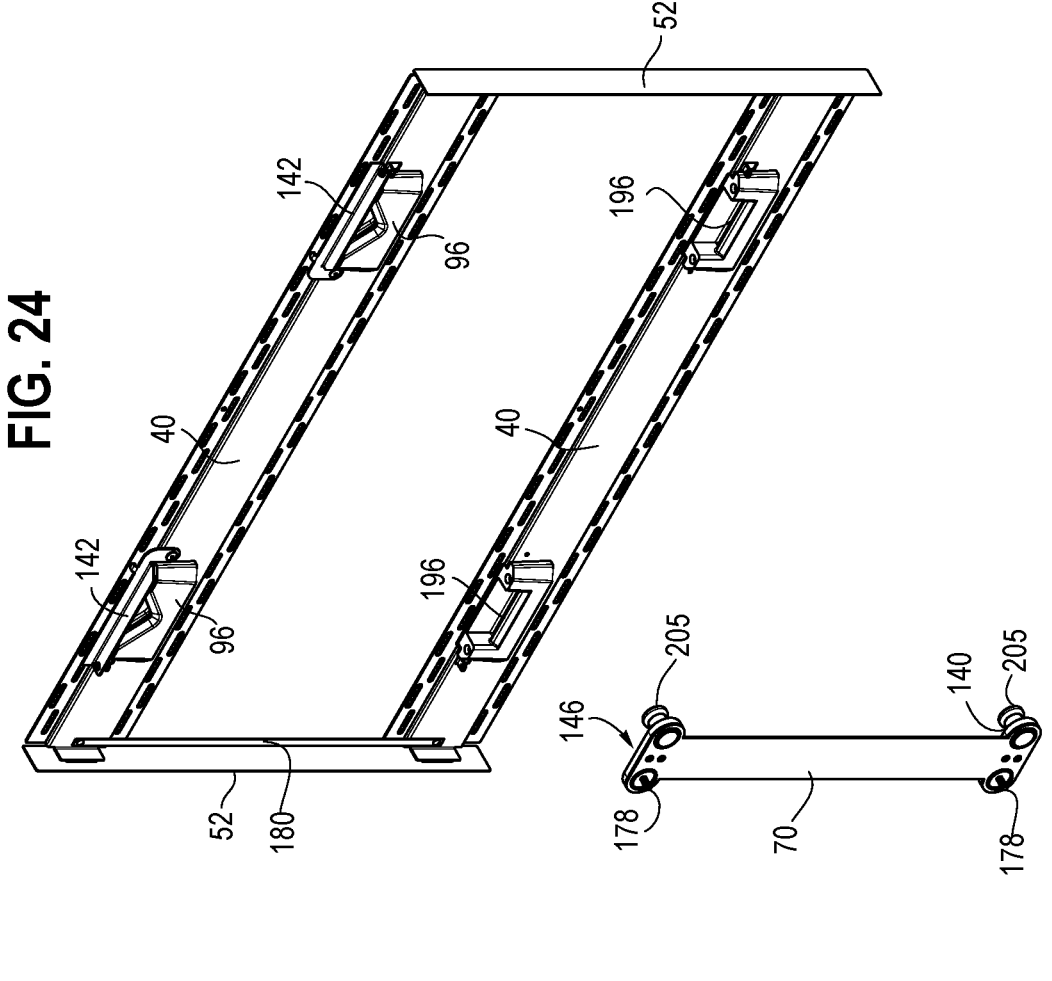
FIG. 24 is a partial, exploded perspective view of the display support assembly shown in FIG. 20.

Each of the top and side walls 30, 34 has one or more pairs of enlarged openings 54, or windows, formed therein. The pairs of windows 54 are spaced apart a distance L1 as shown in FIGS. 15-17. In one embodiment, the windows 54 have a rectangular shape and extend from a bottom edge 56 defined by a horizontal edge formed in the front 34 of the rail about midway therealong, and a top edge 58 formed by a horizontal edge in the top 30.

Figure 5:
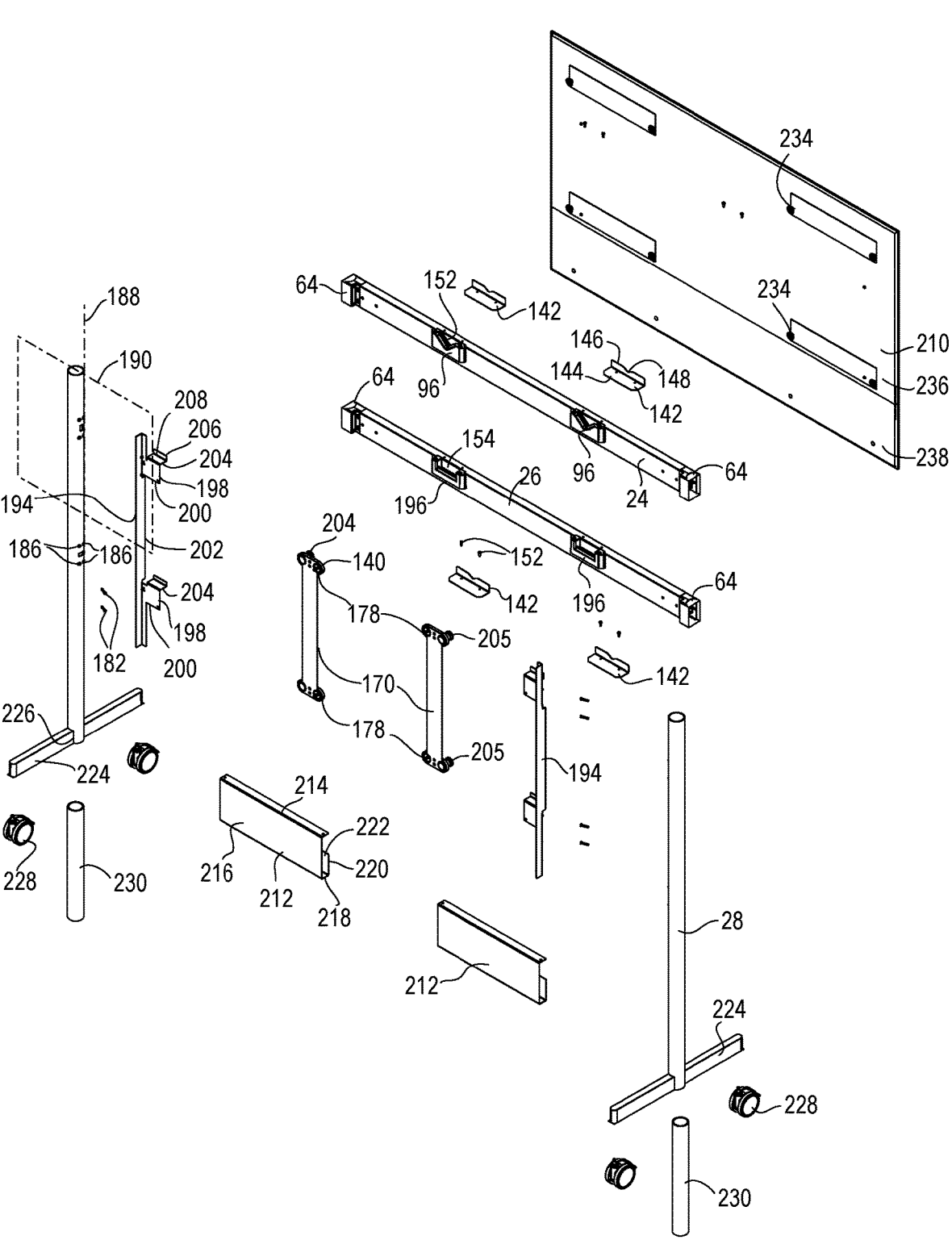
FIG. 5 is an exploded perspective view of the display support system shown in FIG. 1.

Referring to FIG. 5, various embodiments of the support beams 24, 26, 40 may have different lengths to accommodate different display arrays. For example, the support beams may have different lengths, with more than one pair of openings or windows 54 formed in each support beam respectively, so as to support more than one display, e.g., two, three or four displays.

In the embodiment of FIGS. 1-5, 15-17, 19, and 40, the support beams 24, 26 have first and second open ends 60, 62 fitted with end caps 64. The end caps each have an insert portion 66 received in the ends of the beams. The insert portion have a cross-section, e.g., rectangular, shaped to mate with the interior shape of the cavity 38 defined by the support beams. A pair of fasteners 68 secure the beam to the insert portion. The end caps further include a mounting portion 70 extending from the insert portions and defining an interior shoulder 74 at the interface with the insert portion. The shoulder 74, and end surface of the mounting portion, abuts the end of the beam, with the mounting portion adjacent the shoulder having a rectangular profile and outermost exterior surface that matches, or lies flush with, the outer surface of the beams 24, 26. The mounting portion has a stepped portion 72 that extends from one side of the mounting portion and defines a second interior shoulder 76, or inside corner, with a mounting wall 78 defined orthogonal to a side surface 80 of the mounting portion. A pair of vertically spaced fastener openings 82 extend in the longitudinal direction through the stepped portion 72. The end surface 84 of the mounting portion has a concave, curved mounting surface, or shape, defined by side walls 86 and an upper and lower wall 88, 90 and an intermediate rib 92, with the curved, concave end surface mating with a convex, curved outer surface 94 of one of the support posts 28.

Referring to FIGS. 1, 6 and 20, the upper and lower support beams 24, 26 are spaced apart in the Y direction 6, which is the vertical direction in one embodiment, with the beams running parallel to each other. The support beams 24, 26 may be made of any rigid material, including for example and without limitation a metal, such as steel or aluminum, or a plastic, composite or other suitable material.

Receivers

Referring to FIGS. 15-17, 26A-C, 35-39, 47, 51 and 52, a pair of receivers 96 are mounted on and coupled to each of the support beams 24, 26, 40. Each receiver has a lower support platform 98 and an upper body 100, 101. The upper body 100 has a top 102, an open bottom 104, a front wall 106, a rear wall 108 and opposite end walls 110. The support platform 98 includes a base having a rear wall 112 that abuts the front of the support beam. A pair of fasteners 114 secure the rear wall, and support platform, to the front. The support platform includes a pair of posts 116 extending upwardly in a vertical, or second direction 4. The posts may be integrally formed with the base, or may be press-fit into the base, as shown for example in FIGS. 35, 51 and 52, or threadably engaged therewith.

Figures 51, 52:
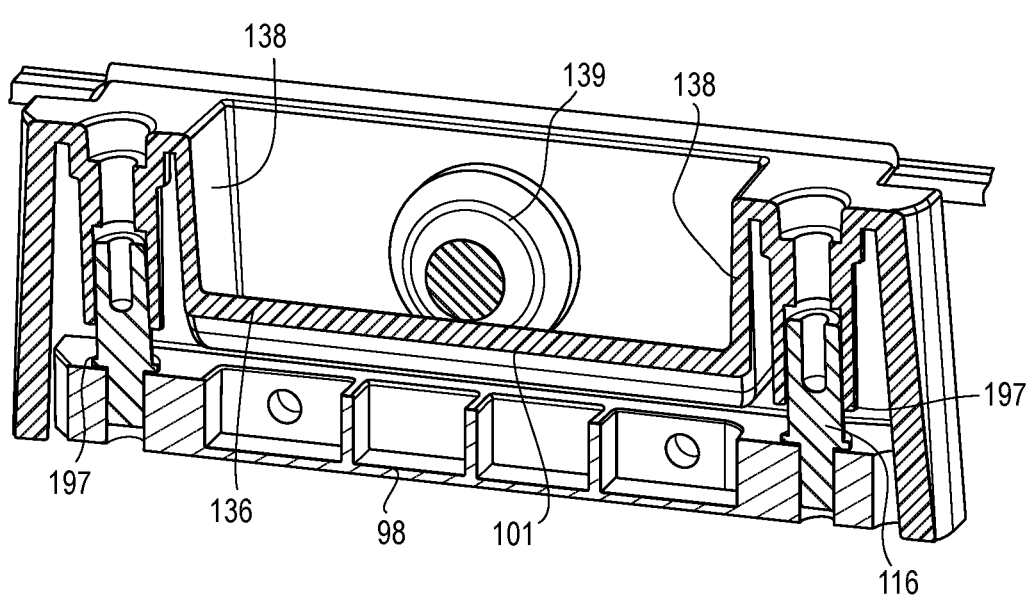
FIG. 51 is a cross-sectional view of a lower receiver engaged by a mounting member.
FIG. 52 is a cross-sectional view of an upper receiver engaged by a mounting member.

The open bottom of the body is disposed over the support platform 98, with the posts extending upwardly into an interior cavity 118 of the body and the base being surrounded by the bottom of the body. The body has a rear insert portion 120 nested in the window 54 defined in the beam. A pair of boss structures 122 extend downwardly from the top into the cavity. Inserts 124 are threadably disposed, or press-fit, in openings 126 formed in the boss structures. Fasteners 128, e.g., set screws, may be threadably adjusted within the inserts 124 to define the vertical position of the screws, which engage the top of the posts 116 of the support platform as shown in FIG. 52. In this way, the height or position of the body 100 may be adjusted relative to the support platform. Alternatively, the fasteners 128 may threadably engage the posts 116, which may include an interior threaded opening.

Figure 25:
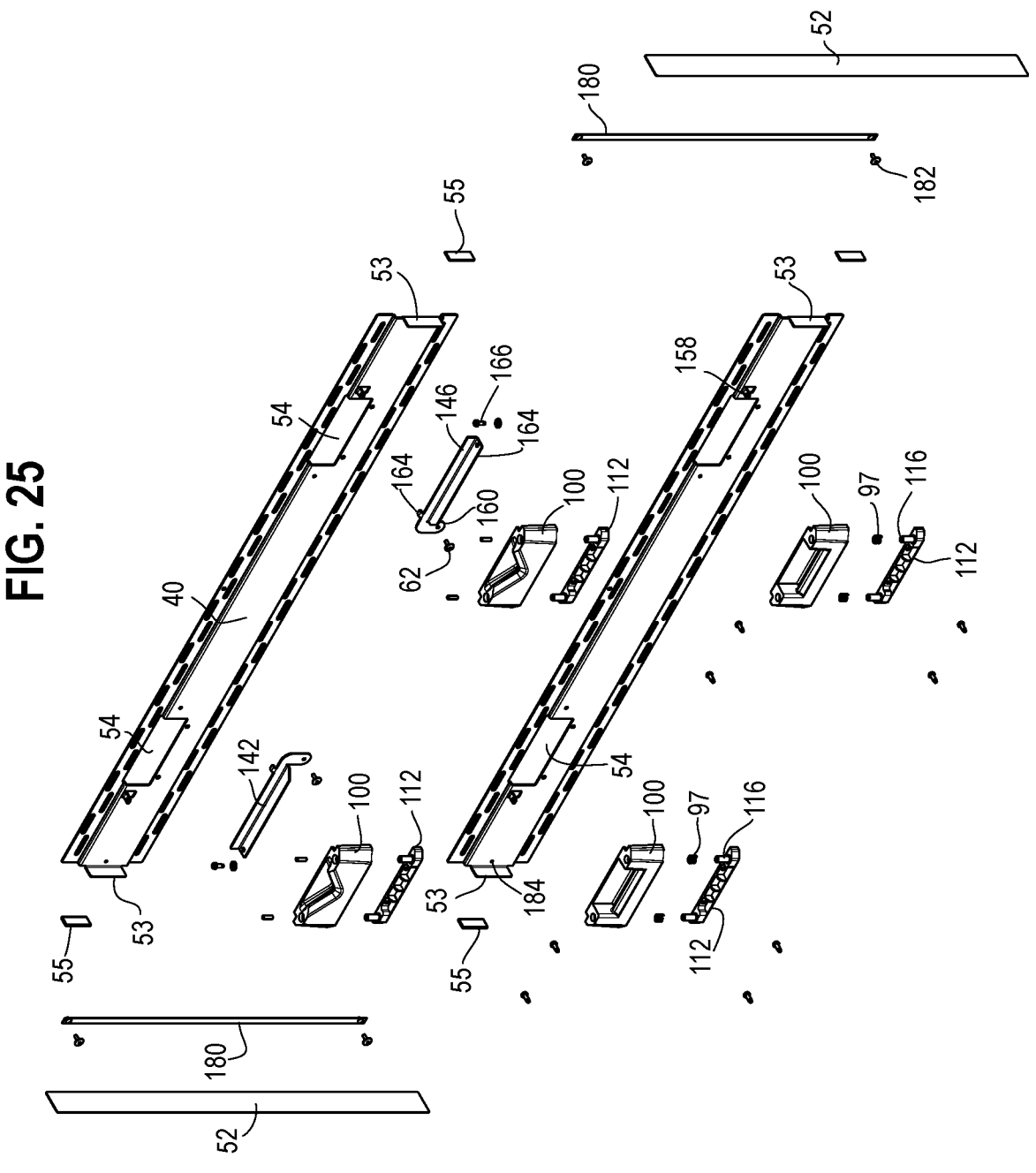
FIG. 25 is an exploded perspective view of the display support assembly shown in FIG. 20.
Figure 26A:
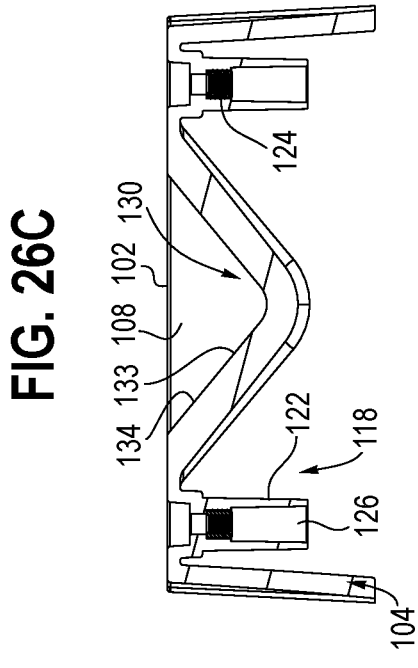
FIG. 26A is a perspective view of a receiver.
Figure 26C:
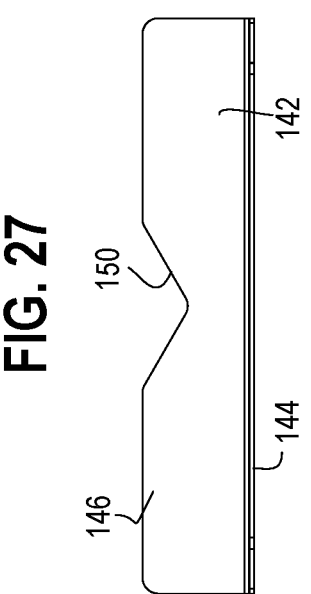
FIG. 26C is a cross-sectional view of the receiver taken along line C-C of FIG. 26B.
Figure 26B:
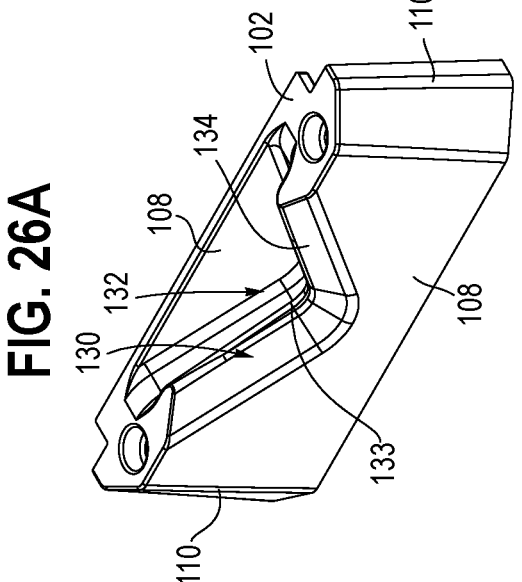
FIG. 26B is an end view of the receiver shown in FIG. 26A.
Figure 27:
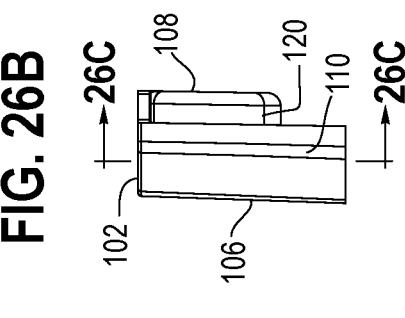
FIG. 27 is a front view of an anti-dislodgement bracket.
Figure 47:
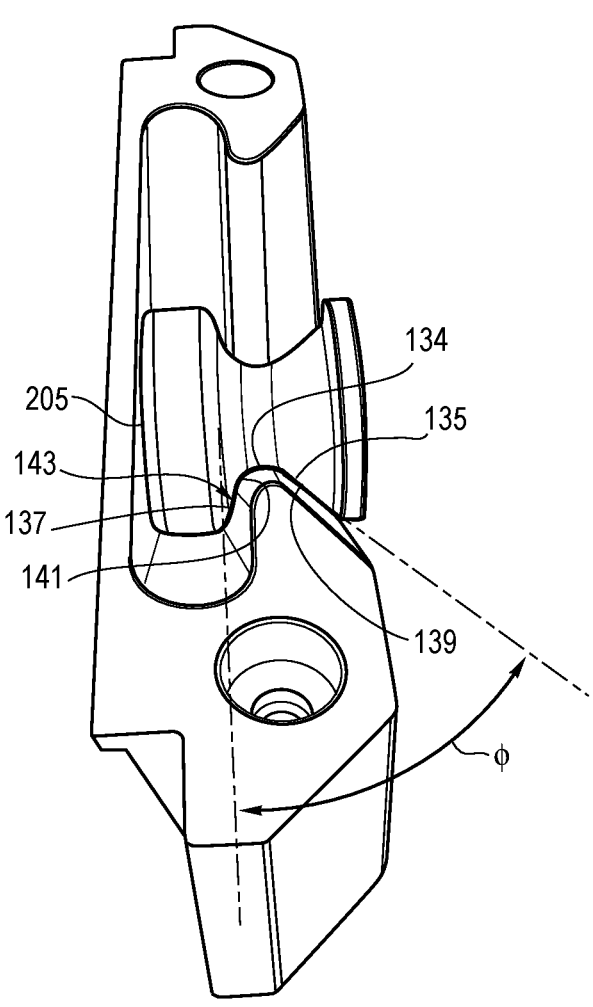
FIG. 47 is a top view of a mounting member engaged with a receiver.

Each receiver 96 defines an upwardly facing receptacles 130. In one embodiment, the receptacles are configured with notches 133 at the front thereof, and with a cavity 132 formed behind the notch. A rim portion 134 defines the notch. In one embodiment, where the receivers 96 are coupled to the upper beam, the rim 134 and notch has a V-shape, with a bottom apex. In addition, as shown in FIG. 47, a front face 135 of the rim portion slopes outwardly, forming an angle 0 relative to the x-direction 2 and rear surface 137, with the front face mating with a surface of the mounting member. The rear surface 137 of the rim portion lies along a substantially vertical plane. In this way, the faces 135, 137 are non-parallel. In another embodiment, receivers 196 are coupled to the lower beam, with a receptacle 148 having a linear, horizontal rim 136 extending between opposite side walls 138. The lower receivers may also include a pair of springs 197 disposed between the support platform and the body as shown in FIGS. 25 and 51. This configuration is particularly helpful with the wall mounted beams, which may have a greater variability of distance between the upper and lower beams, notwithstanding the use of spacers, with the springs 197 accommodating the variability. Due to the different shapes of the upper and lower rims 134, 136, mounting members 140 coupled to the display can settle into the apex, or notch 133 of the V-shaped rims 134 without being constrained by the engagement of the mounting members with the lower linear rim 136, which thereby allows the mounting members some flexibility in moving in the longitudinal direction 2 along the rim 136.

Anti-Dislodgement System

Referring to FIGS. 1-6 and 27, an anti-dislodgment member 142, or bracket, may be removably coupled to the top of the beam across the mouth of the receptacle above the mounting member. In one embodiment, the anti-dislodgment member has a horizontal flange 144 overlying one of the receptacles and abutting the top of the beam on either sides thereof. A pair of fasteners 152 are secured through the flange into the top of the beam. The anti-dislodgment member has a vertical flange 146 extending upwardly from the horizontal flange and having a rear surface flush with a rear surface of the rear of the beam. The vertical flange 146 has a notch 150, configured as a V-shaped notch in one embodiment, although the notch may have other shapes. The anti-dislodgment member may be moved between an open/disengaged position, wherein the top of the receptacle, or mouth 154, 156, is not blocked by removing both fasteners, to a closed/engaged position, wherein the mouth 154, 156 is blocked by the member by securing the fasteners 152, for example after the mounting member 140 is disposed in the receptacles 130, 148.

Figures 44, 45, 46:
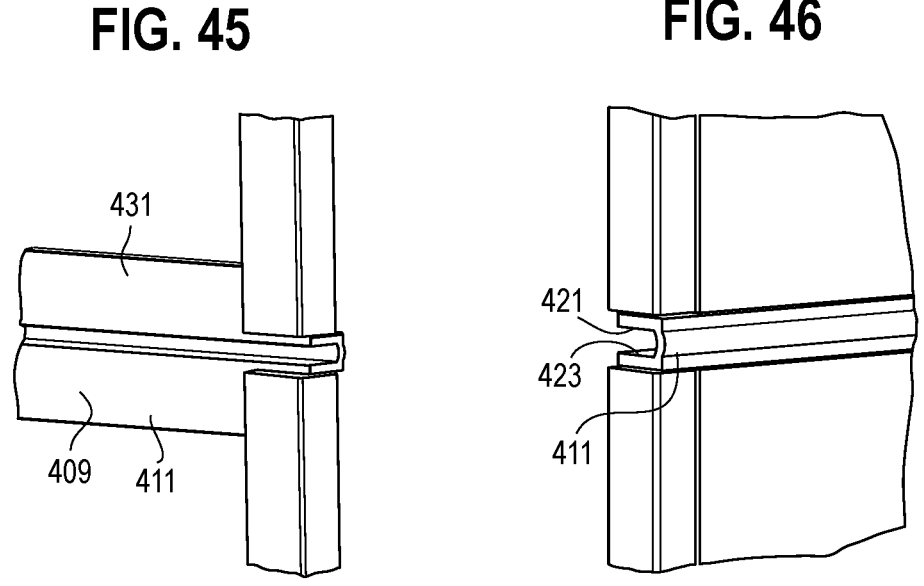
FIG. 44 is a partial front view of a wall mounted display system.
FIG. 45 is a partial front view of upper and lower portions of a tackable screen.
FIG. 46 is a partial rear view of upper and lower portions of a tackable screen.

Referring to the embodiment of FIGS. 20-25, 43 and 44, the beam includes a stop flange 158 or tab, extending outwardly from the front of the beam. In this embodiment, the vertical flange 146 of the anti-dislodgement member includes a downwardly extending ear portion 160 and a horizontally extending portion connected to the vertical flange. The ear portion 160 is pivotally coupled to the front of the beam with a fastener 162, or pin, which defines a pivot axis. The anti-dislodgment member includes a tab 164 extending rearwardly from a top of the vertical flange. The tab 164 functions as a rotation limiter, engaging the upper wall 30 to limit the rotation of the anti-dislodgment member such that it protrudes upwardly at an angle Ω (between 0 and 90 degrees, and preferably between 30 and 60 degrees) and may be easily grasped by a user or installer behind the display. The anti-dislodgment member may be rotated from an open position, wherein the top of the receptacle, or mouth, is not blocked, as shown in FIG. 44, to a closed position, wherein the mouth is blocked by the member, and a fastener 166 is engaged through the member into the stop flange.

Display Mounting Assembly

Referring to FIGS. 1, 6, 20 and 31-34, a pair of display supports 168 are secured to the rear surface of a display, for example with various fasteners. In one embodiment, each display support includes a pair (upper and lower) of mounting members 140, shows as puck members. A pair of longitudinally spaced right and left spanners 170 interconnect the upper and lower mounting members 140. It should be understood that the right spanner is a minor image of the left spanner across a vertical plane, for example as shown in FIG. 31, wherein a generally rectangular spanner has a curved recess formed along one side thereof. Alternatively, the left and right spanners are identical, as shown in FIGS. 5, with the spanners having an I-shape with a vertical stem portion 172 and opposite end portions 174 each defining a pair of horizontally spaced lobes 176, but with the mounting members 140 coupled to different (e.g., outboard) lobes at the ends of the spanner.

For example, as shown in FIGS. 5, 6 and 31-34, the left spanner has spaced apart upper and lower end portions 174 connected with an elongated stem 170 that is dimensioned so as to ensure the end portions are properly located relative to the receivers 96, 196 on the upper and lower beams. The lobes are each configured with openings 97, which are horizontally spaced. One of the lobes at end of the spanners, shown as the inboard lobes, has an opening 97 that overlies the rear of the display. A fastener 178 extends from the mounting member through an opening 219 on the mounting member, through one of the openings 97 in the lobe and outwardly from the lobe toward the display, wherein after it may threadably engage the display. The fastener 178 secures the mounting member, the lobe and spanner to the display 8. In this way, a plurality, shown as four, fasteners 178 secure the spanners 170 to the display 8.

Referring to FIGS. 1, 6, 31-34, 47, 51 and 52, the mounting member 140 has an elongated base 141 having an obround shape. A front surface of the base has a pair of hubs 201, 203 that are shaped and dimensioned to be received in the openings 97 and thereby locate the base 141 and mounting member 140 on the spanner 170. The mounting member includes a puck 205 having a rear surface that is substantially flat, and a front curved surface 207. In one embodiment, the puck is configured as a disc, with a circular shaped head 229, although it may be other shapes. An elongated coupling member defining a neck 209, configured in one embodiment as a shaft, extends between the head 229 and the base and is sized and dimensioned to engage one of the rims 134, 136. As shown in FIG. 47, the neck has a sloped surface 139 having the same angle θ (e.g., between 0 and 90 degrees and preferably between 30 and 60 degrees), which mates with the front surface 135 of the rim 134. The neck has a concavely curved transition portion 141, which mates with the convexly shaped rim 134, and a front surface 143 that mates with and engages the surface 137. The interface of the surfaces of the puck with the surfaces of the receiver rim ensure that the puck easily mates with and settles into engagement with the receiver. In one embodiment, the puck and base are integrally formed. In other embodiments, the puck may be separate from the base and connected thereto with a connector such as a fastener.

After the base is located on the spanner, with the hubs fitted in the openings, a pair of fasteners 211 extend through the spanner and threadably engage openings 251 formed in the base at a midpoint between the openings. A cap 213 may threadably engage the hub 203 aligned with the puck and close or cover the opening 97.

Operation

In operation, and referring to the embodiment of FIGS. 20-25, the display supports 168 are secured to the rear of the display 8. The receivers 96, 196 are coupled to the beams 24, 26, with an upper or lower beam being leveled (e.g. with a built in bubble level or with a separate bubble level) and thereafter secured to the wall 50 with fasteners 48 extending through the vertical flanges 44, 46. The other of the upper or lower beam is then located on the wall using a pair of spacers 180, 51, shown in FIGS. 25 and 42. In particular, one end of each spacer 180, 51 is secured to an end of the beam through an opening 184 formed in a front of the beam with a fastener 182, or by way of engagement of the flanges 43, 45 with the beam 40. The opposite ends of the spacer are likewise secured to the front of the other beam, or side opening of the beam, which may thereafter be secured to the wall with fasteners 48, which eliminates the need to level, measure and locate the second beam relative to the first beam. In this way, the beams 24, 26 are automatically located to be aligned with the mounting members 140.

With the anti-dislodgment members 142 in an open position, the display supports 168, with the display 8 attached, are positioned such that the pucks, and in particular the neck 209, of the two upper mounting members are inserted onto the pair of receptacles, or notches and settle in the bottom of the notch with the heads 229 received in the cavity 132 of the receptacle and the surfaces 139, 143 engaging surfaces 135, 137. The anti-dislodgement member 142 may then be moved to the closed or engaged position, wherein the anti-dislodgment member is pivoted or disposed over the mounting member and across the mouth of the receptacle adjacent to and above the necks 209, such that the pucks 205 may not be removed from the receptacles. The head of the puck engages the surface 137 of the body as the neck is supported in the bottom of the notch on the rim 134 to secure the display on the receiver and beam.

Support Cart

Referring to FIGS. 1-5 and 30, a support cart embodiment of the display support assembly includes upper and lower beams 24, 26 and a pair of posts 28 spaced apart in the first, horizontal direction 2. The posts each have two pairs of vertically spaced openings 186 laterally offset from a vertical centerline 188 defined along a vertical (X/Y) plane 190 bisecting the spaced apart posts. The end caps 64 of the beams are secured to each post with a pair of fasteners 192 extending in the first direction 2 and engaging one of the pairs of openings 186 on either side of the plane 190. The end caps on the left and right hand sides may be rotated 180 degrees about the Z axis relative to each other such that the stepped portions of both end caps extend forwardly from the front of the beams. The rear surface of the end caps and beams are flush.

A pair of vertically extending end brackets 194 are secured to the front of the upper and lower beams adjacent the opposite ends thereof. The brackets each include upper and lower tabs 198 engaging keyholes formed in the end caps. Additional fasteners may be used to secure the brackets to the beams. The bracket each include a pair of front vertical flanges 200 extending inwardly from an L-shaped elongate member 202 and overlying the front of the beams, horizontal flanges 204 extending rearwardly from the top of the front flanges and overlying the top of the beam and a rear vertical flange 206 extending upwardly from the horizontal flange. The rear flange has an upper edge 208 that supports a screen 210 as further discussed herein, and may include a v-notch 211.

Figure 48A:
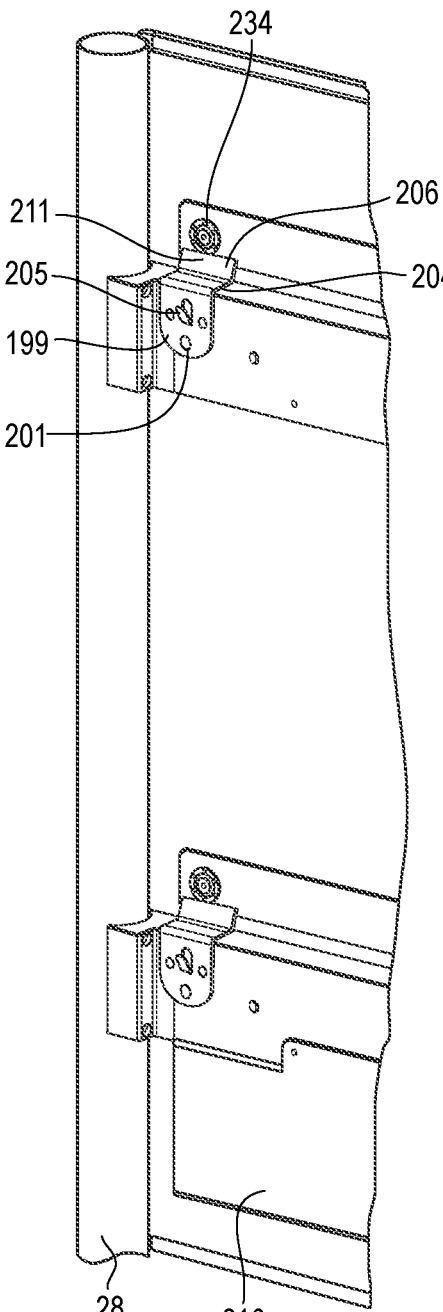
FIGS. 48A and B are partial front views of one embodiment of a display support.
Figure 48B:
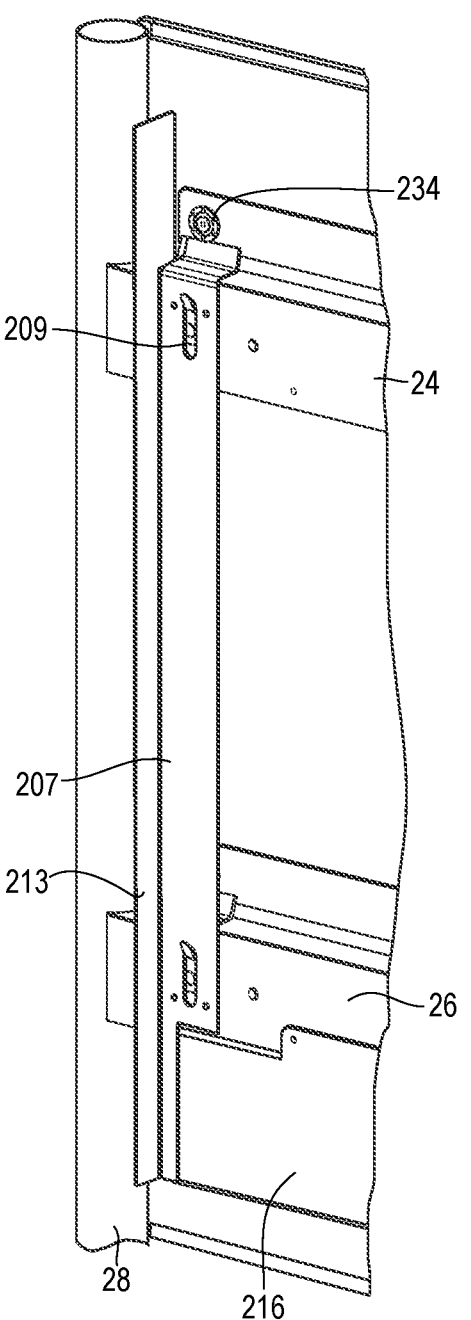

In an alternative embodiment, shown in FIGS. 48A and B, the end brackets are separated into two pieces. A first bracket 199 is secured to the front face of the beam with fasteners extending through a flange 201. The flange 204 extends rearwardly from the flange 201 and the flange 206 extends upwardly from the flange 204. The front flange 201 has a forwardly and upwardly extending tab 205. A trim bracket 211 has an elongated flange 207 with openings received over and engaging the tabs 205. A second flange 213 extends along the side of the display and covers the gap between display and the support beams.

A pair of cable troughs 212, each have an upper, horizontal mounting flange 214 coupled to the bottom of the lower beams, for example with fasteners. In an alternative embodiment, the flange 214 may be omitted, with a front wall 216 mounted directly to a face of the beam as shown in FIGS. 48A and B. The troughs have a J-shaped channel, including a front wall 216, a bottom wall 218 and a rear wall 220 defining a rearwardly and upwardly opening channel 222. In one embodiment, a single cable trough extends across the entire width of the beam.

A pair of feet 224 are coupled to the bottom of the posts 28, with the posts having a pair of cutouts 226 fitting over the top and along the sides of the feet 224. The feet extend transverse in the Z-direction 4. A floor interface member 228, such as a caster, glide, wheel or foot is coupled to the ends of the feet and engage the floor. The bottom of the post 28 has a washer 237 or other bottom welded across the interior thereof above the notch 226. The washer has a fastener hole 239 that receives a fastener 261 extending upwardly from one of the feet.

Figure 28:
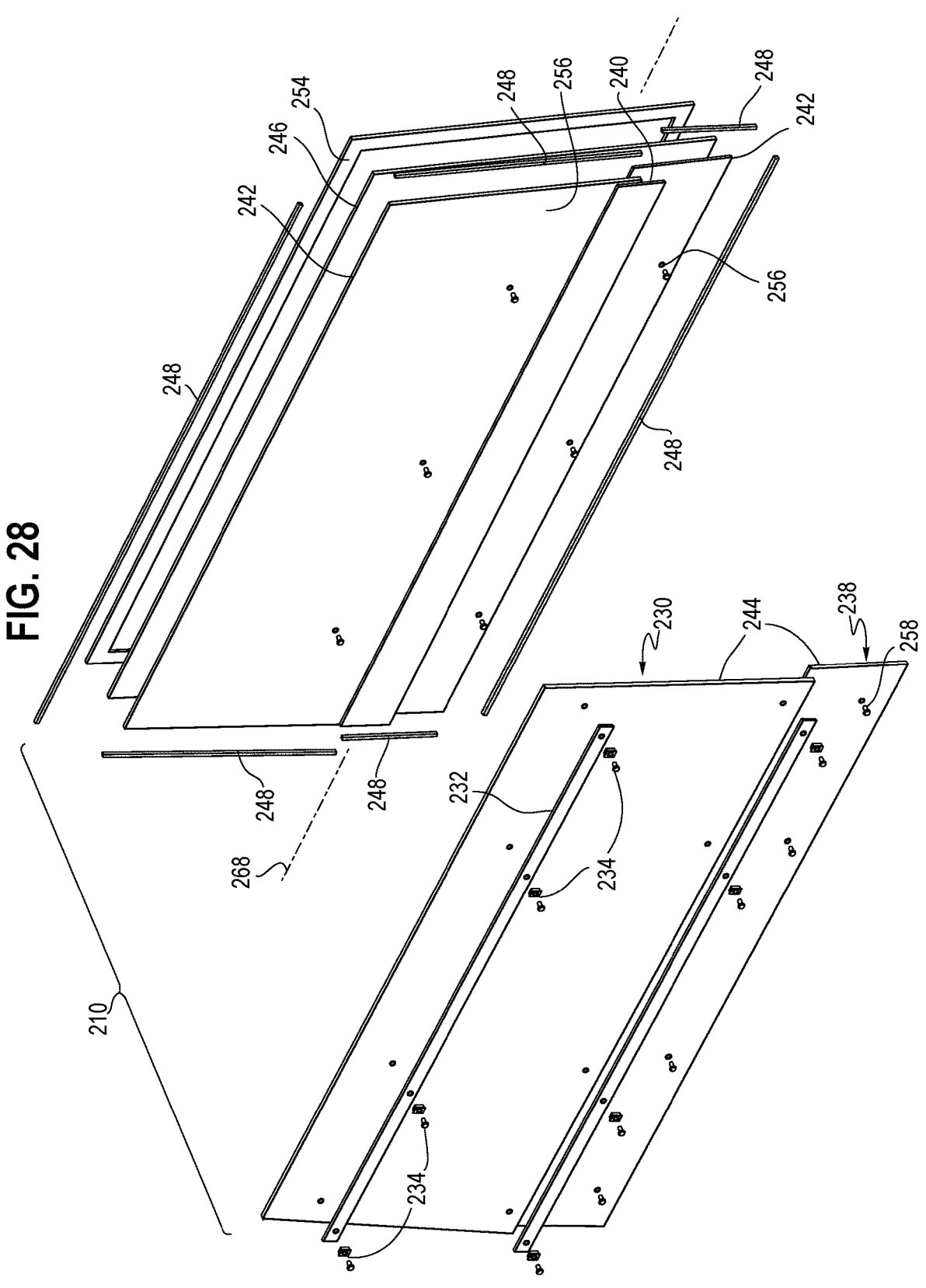
FIG. 28 is an exploded perspective view of a screen.
Figure 29:
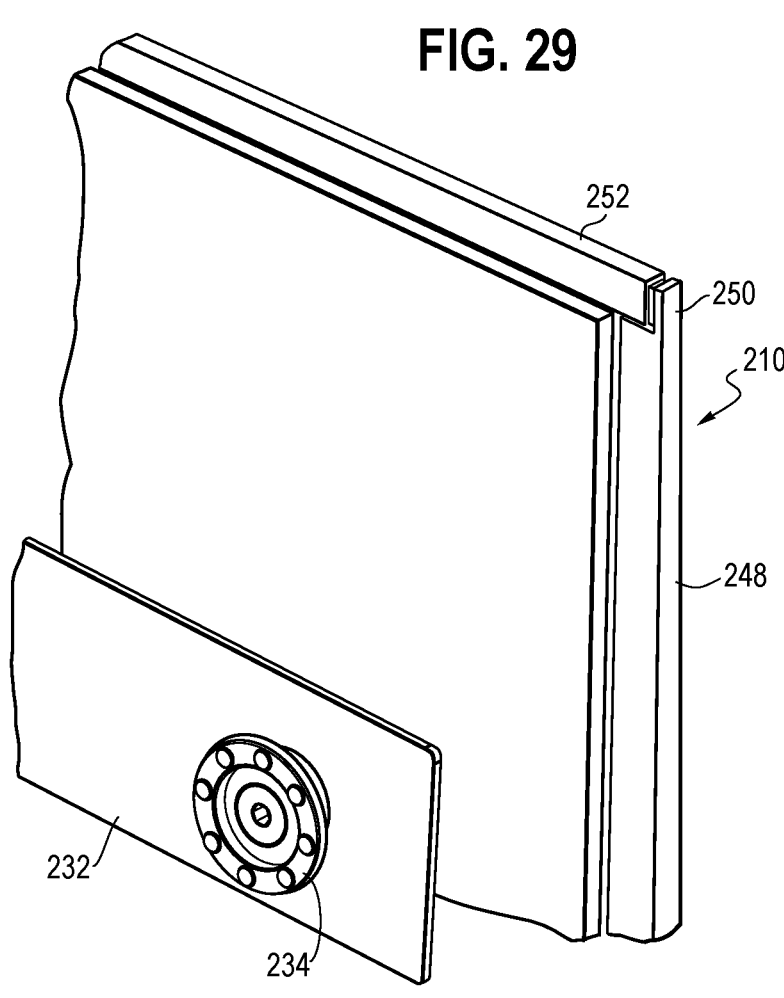
FIG. 29 is an enlarged, partial view of the corner of the screen shown in FIG. 28 without the fabric applied.
Figure 30:
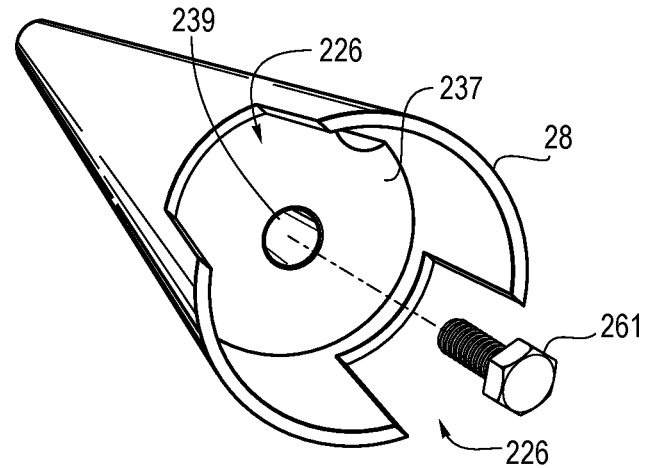
FIG. 30 is a bottom view of a post.
Figure 39:
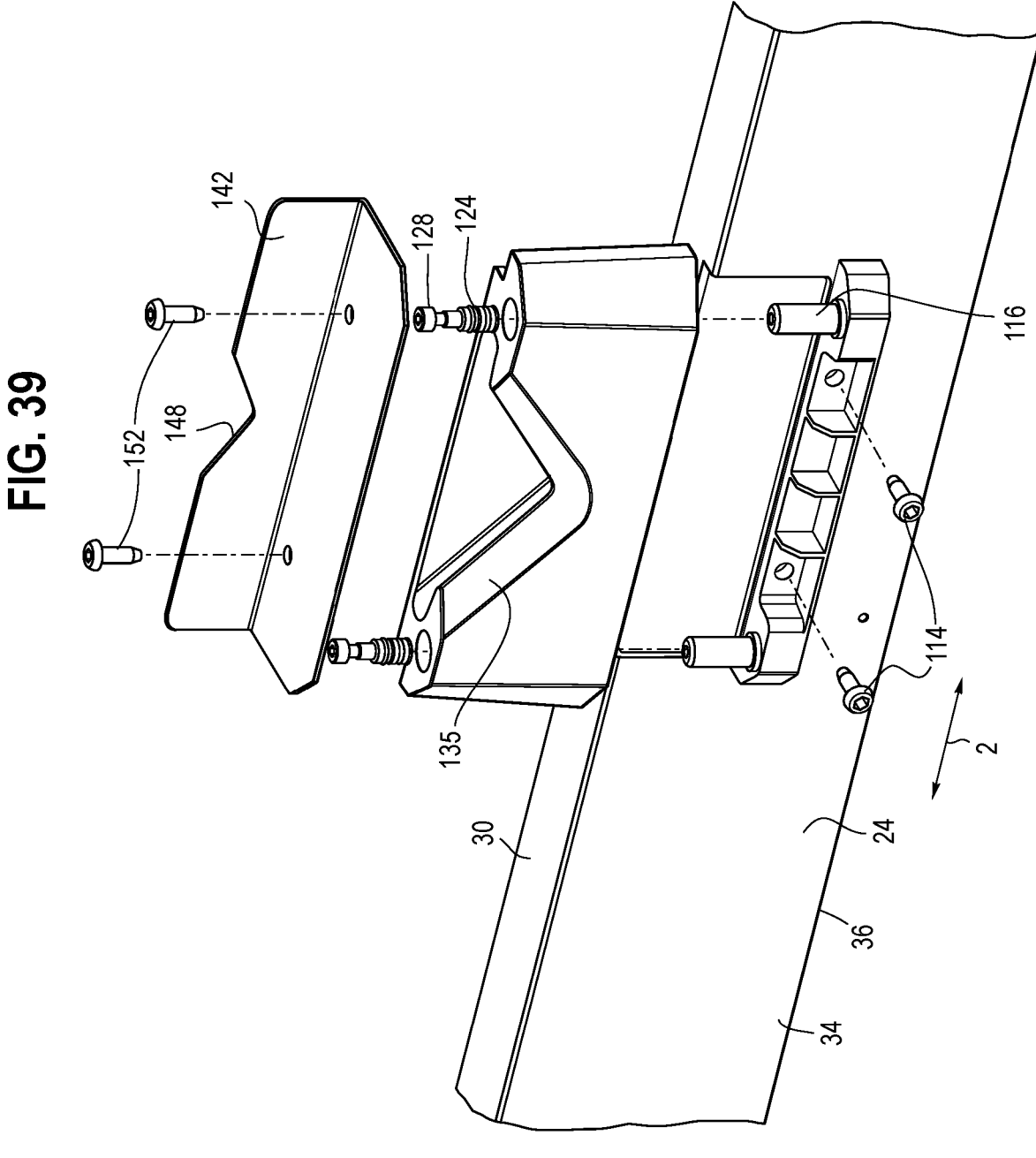
FIG. 39 is a partial, exploded perspective view of one embodiment of a receiver applied to a beam.
Figure 40:
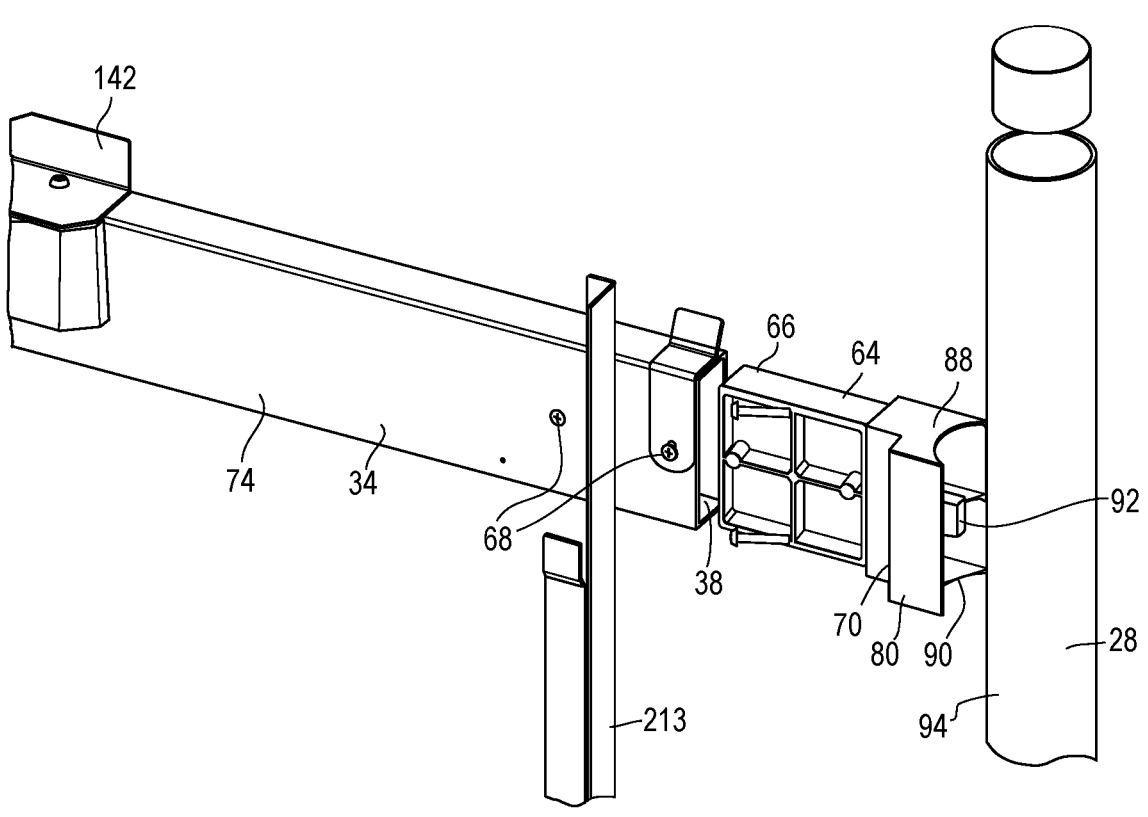
FIG. 40 is a partial, exploded view of a beam applied to a support post.
Figure 41:
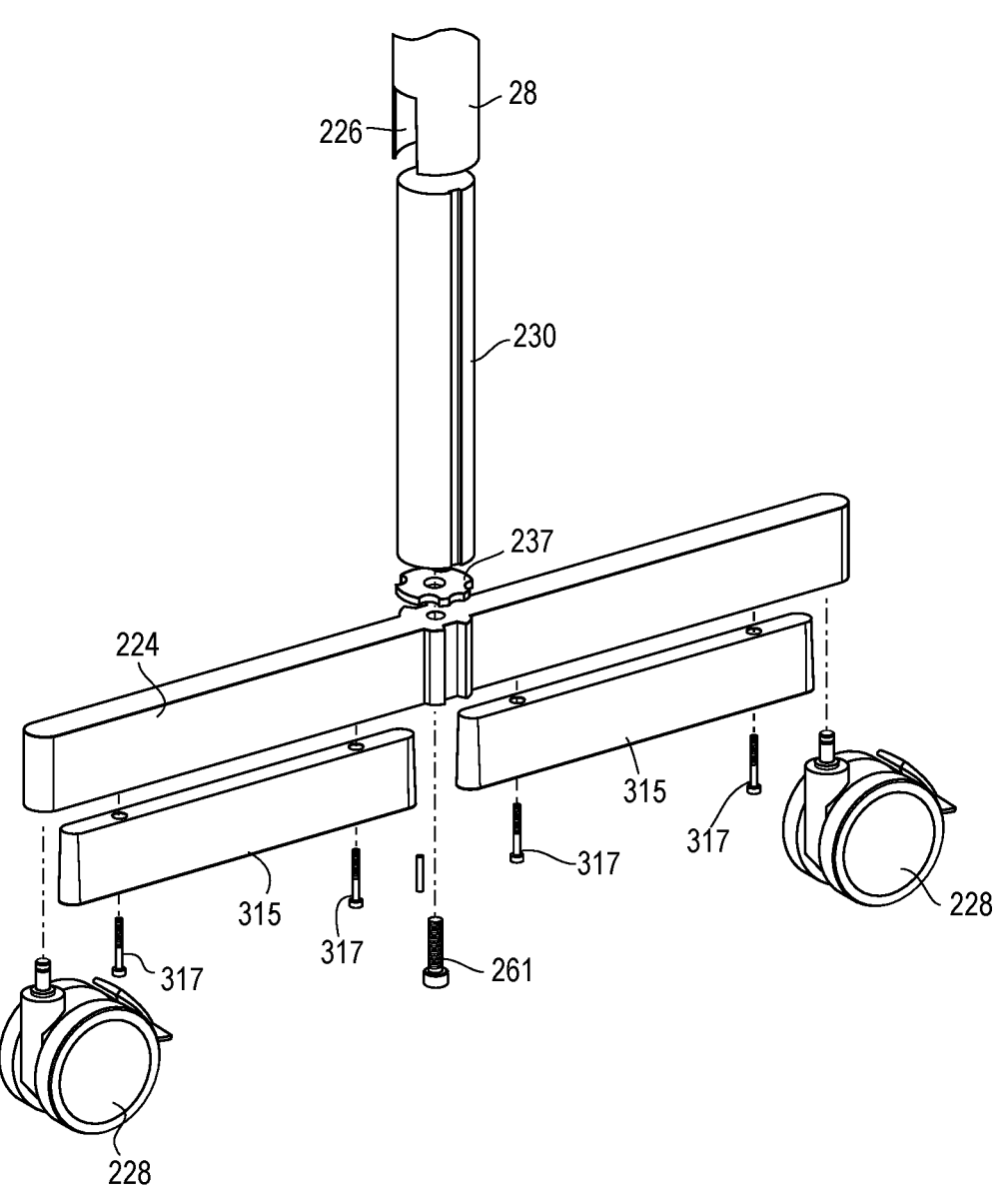
FIG. 41 is a partial, exploded view of a support post and foot.

Referring to FIGS. 5, 30 and 41, a counterweight ballast member 230, for example an elongated cylindrical component, made for example of lead, steel or another heavy metal, may be disposed in the bottom of the tubes and rest on top of the washer, or be welded thereto or engaged by fastener 261. Likewise, the feet may be made of solid metal, for example a solid steel bar defining a counterweight ballast, or may be made as a tube or other structure holding such a counterweight. For example, in one embodiment, the feet are cored out die cast, with steel inserts 315 disposed in a recess in the bottom of the feet and secured thereto with fasteners 317. The ballast, or counterweights, in the post and feet may also include sand, water, or other known and suitable ballast materials Referring to FIGS. 5 and 28, the screen 210 or panel, which may be tackable, is coupled to the cart on the backside of the cart, thereby covering the rear of the display. The screen includes a plurality of, e.g., two or four, plates 232, each configured with two mini-pucks 234, with the plates and mini-pucks secured to an upper portion 236 of the screen. The mini-pucks are received in the V-shaped notches 150 formed in upstanding flanges 146 of anti-dislodgement members 142, and engage the upstanding flanges 206, or upper edge 208, defined by the end brackets, and may be received in notches formed therein. The mini-pucks are disposed in the notches and engage the flanges, with the screen hanging on the brackets by the force of gravity. It should be understood that the screen may also be made of a writable material, such as whiteboard, or may be capable of engaging magnets.

The tackable screen includes a laminate structure. The screen has upper and lower portions 236, 238 coupled with a horizontally extending hinge 240, for example a living hinge, defining a pivot axis 268 extending in the longitudinal, X direction 2. Both the upper and lower portions have a fiberglass layer 242 and a PET layer 244 coupled to each other, for example with adhesive or hot melt. An elastic fabric strip overlaps with both the upper and lower portions and defines in part the living hinge. Alternatively, as shown in FIGS. 45 and 46, a hinge member 409 may be made of an extrusion having upper and lower flanges 411, 413 secured to the upper and lower portions of the screen, and a middle hinge portion 417 having an elongated slot and opposite upper and lower walls 421, 423. The hinge portion 417 may open, with the walls 421, 423 moving away from a parallel relationship as the lower portion is moved relative to the upper portion. On the rear of the screen a single, unitary thermoplastic layer 246, made for example of Rhenoflex material, extends over and covers the upper and lower portion. The layer 246 may be omitted.

Figure 49:
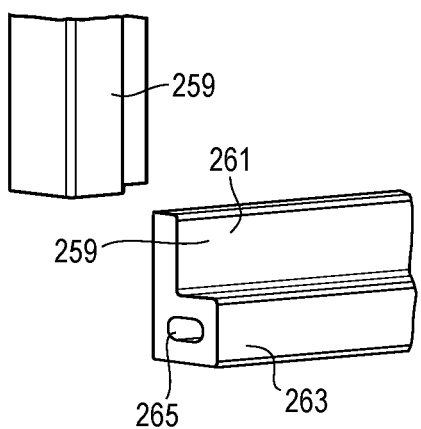
FIGS. 49 and 50 are partial views of perimeter frame elements.
Figure 50:
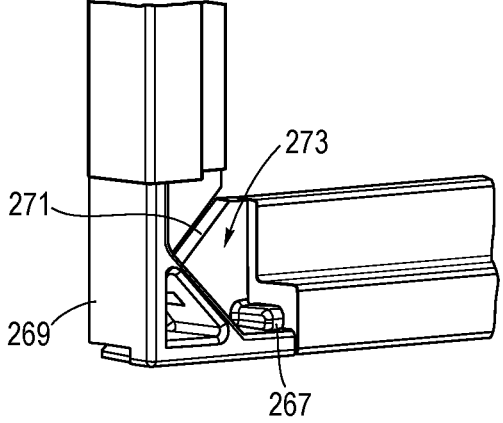

A perimeter frame element 248, configured as a plurality of L-shaped extrusions having a notched end portion 250 overlapping an end portion 252 of a mating element at a corner junction. The extrusions may be made of plastic, with the frame elements being applied to an underlying fiberglass layer 242 with a spray adhesive. The perimeter frame elements protect the edges of the panel and also provide a sharper/straighter edge to the panel. The perimeter frame elements along the side of the panel are separated at the junction of the upper and lower portions. An outer fabric layer 254 is wrapped around and over the perimeter extrusions and is bonded to the backside of the panel with spray adhesive. The corners may be trimmed with a hot knife. In an alternative embodiment, shown in FIGS. 49 and 50, the L-shaped extrusions 259 have a face flange 261 and a base 263, with the base having an opening 265 formed in the ends thereof. A corner element 269 has a pair of insert portions 267 extending therefrom at 90 degrees, with the insert portions disposed in the openings 265. The corner element has a face flange with a diagonal slot 271 and a cavity 273 formed behind the face flange. Corner portions of the fabric layer 154 may be tucked or inserted through the slot 271 and into the cavity 273.

The upper and lower portions 236, 238 are each configured with magnets 256, show as two row of three, which are attracted to each other to hold the lower and upper portions together in an open configuration. The lower portion also has an additional four magnets 258, which engage the trough.

In operation, the lower portion 238 may be pivoted relative the upper portion 236 about the pivot axis to access the cable trough channel 222. The magnets on the lower portion are released from the trough allowing the lower portion to be pivoted, and thereafter be engaged with the magnets on the upper portion.

Wall Mounted Leaner System

Figure 7:
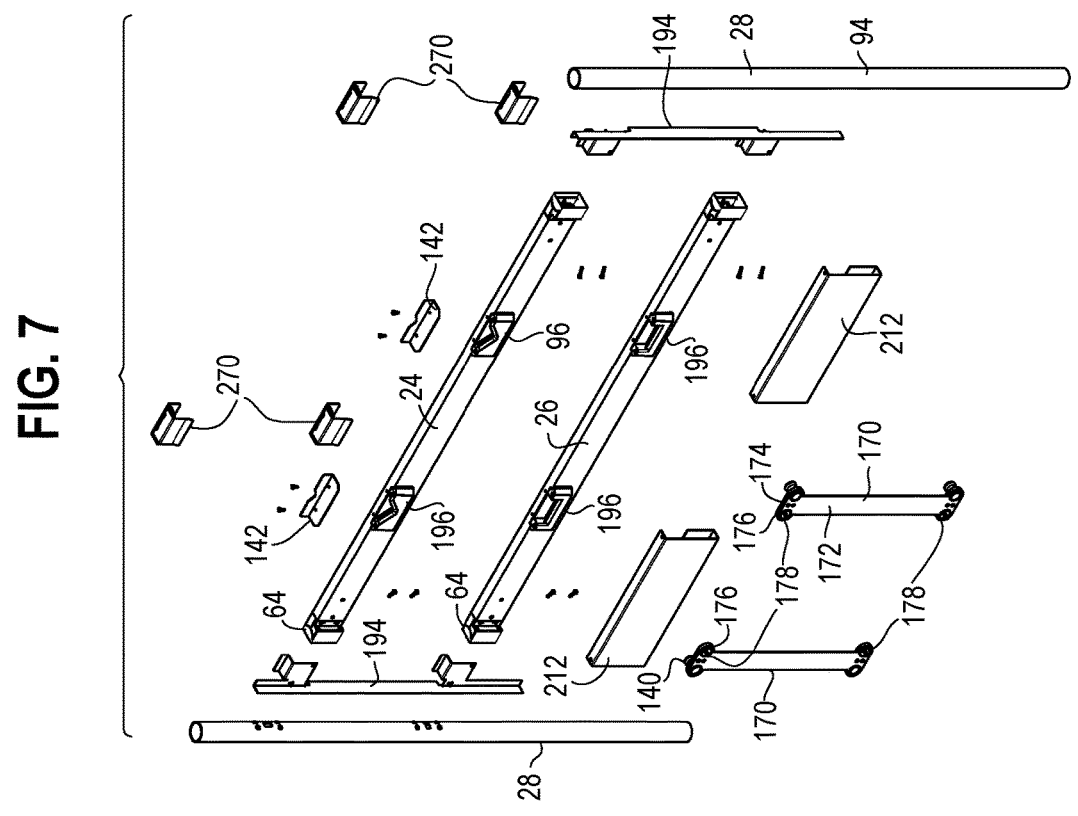
FIG. 7 is an exploded perspective view of the display support system shown in FIG. 6.

In another embodiment, as shown in FIGS. 6 and 7, the same post 28 and beam structure 24, 26 is used, but without the feet or notches in the post. The screen 210 may also be omitted. Instead, a pair of wall mount brackets 270, or bracket assemblies, are used to secure the display support system to the wall, as shown in FIGS. 9-13. Each wall mount bracket 270 includes a first, engagement bracket 272 having a vertical flange 276 and a horizontal flange 278, and a second, wall bracket 274 also having a vertical flange 280 and a horizontal flange 282, with the horizontal flanges overlapping. The engagement bracket includes a pair of outer tabs 284 and a center tab 286 extending downwardly from a rear edge of the horizontal flange 278. The outer tabs 284 are spaced slightly rearwardly of the center tab in the Z direction 4 so as to define a gap therebetween. Each of the tabs 284, 286 is resilient, meaning they may flex and return to their original shape without elastic deformation. The front vertical flange 276 has a bottom edge portion 288 that is bent slightly forwardly so as to provide a sliding interface with the beam.

The horizontal flange 282 of the rear, wall bracket is divided into outer portions 288, each having a series of laterally spaced slots 290 shaped and sized to receive the outer tabs 284 of the first bracket. A gap or space 292 is defined between the outer portions and is shaped and sized to receive the center tab. The vertical flange 280 is configured with a plurality of slots 294, which receive fasteners securing the wall bracket to the wall 50.

In operation, the wall brackets 274 are secured to the wall 50 at a height wherein the horizontal flange(s) will overlie the top of the upper or lower beam 24, 26. The display support system is then positioned adjacent or against the wall, with the posts 28 engaging the floor. The engagement bracket 272 is then fitted onto the wall bracket, with the outer tabs 284 inserted into a set of slots 290 in the outer portions of the flange and with the front, vertical flange 276 engaging the front of the beam 24, 26, for example the upper beam. In this way, the bracket assembly 270, and the downwardly opening channel 296 defined between the vertical flanges 276, 280, can be configured to accommodate a variety of differently sized or positioned beams relative to the wall. Specifically, the overlapping horizontal flanges are adjustable coupled such that the gap defined between the vertical flanges may be varied. It should be understood that the vertical flange 280 of the wall bracket may extend upwardly from the vertical flange, with the gap defined between the vertical flange of the engagement bracket and the surface of the wall.

Although the present invention has been described with reference to preferred embodiments, those skilled in the art will recognize that changes may be made in form and detail without departing from the spirit and scope of the invention. As such, it is intended that the foregoing detailed description be regarded as illustrative rather than limiting and that it is the appended claims, including all equivalents thereof, which are intended to define the scope of the invention.

What is claimed is:

1. A wall mount bracket assembly comprising:
   a first bracket comprising a first vertical flange and a first horizontal flange having a first end connected to the first vertical flange and a second end spaced apart from the first vertical flange;

a second bracket comprising a second vertical flange and a second horizontal flange having a first end connected to the second vertical flange and a second end spaced apart from the second vertical flange, wherein the first and second horizontal flanges of the first and second bracket are adjustably coupled such that a horizontal gap defined between the first and second vertical flanges of the first and second brackets is variable, wherein the first and second vertical flanges of the first and second brackets define a channel opening downwardly relative to the first and second horizontal flanges of the first and second brackets, and wherein the second ends of each of the first and second horizontal flanges are positioned between the first and second vertical flanges.

2. A wall mount bracket assembly comprising:
a first bracket comprising a vertical flange and a horizontal flange;
a second bracket comprising a vertical flange and a horizontal flange, wherein the horizontal flanges of the first and second bracket are adjustably coupled such that a gap defined between the vertical flanges of the first and second brackets are variable, wherein the first and second brackets define a channel opening downwardly relative to the horizontal flanges of the first and second brackets;
wherein the horizontal flange of the first bracket comprises a plurality of laterally spaced slots, and wherein the second bracket comprises a tab extending downwardly from the horizontal flange, wherein the tab is removably inserted into one of the plurality of slots, and wherein portions of the horizontal flanges of the first and second brackets overlap.

3. The wall mount bracket assembly of claim 2 wherein the horizontal flange of the first bracket comprises two longitudinally spaced apart series of the plurality of laterally spaced slots, and wherein the second bracket comprises a pair of the tabs, wherein the tabs are longitudinally spaced apart, and wherein each of the pair of tabs are removably inserted into one of the slots in each of the series of slots.

4. The wall mount bracket assembly of claim 3 wherein the horizontal flange of the first bracket comprises a pair of longitudinally spaced apart outer portions defining an open space therebetween, each of the outer portions having one of the series of the plurality of laterally spaced slots formed therein.

5. The wall mount bracket assembly of claim 4 wherein the second bracket comprises a center tab disposed in the open space between the outer portions.

6. The wall mount bracket assembly of claim 5 wherein the pair of tabs and the center tab extend from an edge of the horizontal flange of the second bracket.

7. The wall mount bracket assembly of claim 6, wherein the center tab is laterally spaced from the pair of tabs.

8. The wall mount bracket assembly of claim 2 wherein a bottom edge portion of the vertical flange of the second bracket is bent away from the vertical flange of the first bracket.

9. The wall mount bracket assembly of claim 5 wherein the tabs and the center tab are resilient.

10. The wall mount bracket assembly of claim 2 wherein one of the vertical flanges of the first and second bracket comprises a fastener opening.

11. The wall mount bracket assembly of claim 10 wherein the fastener opening comprises a plurality of elongated slots.

12. A method of securing a component to a wall comprising:
fastening a vertical flange of a first bracket to the wall such that a horizontal flange of the first bracket extends outwardly from the wall;
positioning the component under the horizontal flange and abutting the vertical flange of the first bracket;
releasably coupling the horizontal flange of the first bracket with an overlapping horizonal flange of a second bracket, wherein ends of the horizontal flanges of the first and second brackets are positioned between the vertical flanges of the first and second brackets; and
abutting the component with a vertical flange of the second bracket, wherein the first and second brackets define a channel in which the component is disposed, wherein the channel opens downwardly relative to the horizontal flanges of the first and second brackets.

13. A method of securing a component to a wall comprising:
fastening a vertical flange of a first bracket to the wall such that a horizontal flange of the first bracket extends outwardly from the wall;
positioning the component under the horizontal flange and abutting the vertical flange of the first bracket;
releasably coupling the horizontal flange of the first bracket with an overlapping horizonal flange of a second bracket; and
abutting the component with a vertical flange of the second bracket, wherein the first and second brackets define a channel in which the component is disposed, wherein the channel opens downwardly relative to the horizontal flanges of the first and second brackets;
wherein the horizontal flange of one of the first and second brackets comprises a plurality of laterally spaced slots, and wherein the other of the first and second brackets comprises a tab extending downwardly from the horizontal flange of the other of the first and second brackets, and wherein releasably coupling the horizontal flange of the first bracket with an overlapping horizontal flange of a second bracket comprises removably inserting the tab into one of the plurality of slots.

14. The method of claim 13 wherein the horizontal flange of the one of the first and second brackets comprises two longitudinally spaced apart series of the plurality of laterally spaced slots, and wherein the other of the first and second brackets comprises a pair of the tabs, wherein the tabs are longitudinally spaced apart, and wherein each of the pair of tabs are removably inserted into one of the slots in each of the series of slots.

15. The method of claim 14 wherein the horizontal flange of the one of the first and second brackets comprises a pair of longitudinally spaced apart outer portions defining an open space therebetween, each of the outer portions having one of the series of the plurality of laterally spaced slots formed therein.

16. The method of claim 15 wherein the other of the first and second brackets comprises a center tab disposed in the open space between the outer portions.

17. The method of claim 16 wherein the pair of tabs and the center tab extend from an edge of the horizontal flange of the other of the first and second brackets.

18. The method of claim 17, wherein the center tab is laterally spaced from the pair of tabs.

19. The method of claim 13 wherein a bottom edge portion of the vertical flange of the second bracket is bent away from the vertical flange of the first bracket.

20. The method of claim 13 fastening the vertical flange of the first bracket to the wall comprises inserting a fastener through one of a plurality of elongated slots formed in the vertical flange of the first bracket.

* * * * *